US008791751B2

(12) United States Patent
Ueki et al.

(10) Patent No.: US 8,791,751 B2
(45) Date of Patent: Jul. 29, 2014

(54) SEMICONDUCTOR INTEGRATED CIRCUIT AND METHOD OF REDUCING POWER CONSUMPTION

(71) Applicant: Renesas Electronics Corporation, Kanagawa (JP)

(72) Inventors: Makoto Ueki, Kanagawa (JP); Naoya Inoue, Kanagawa (JP); Yoshihiro Hayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/749,577

(22) Filed: Jan. 24, 2013

(65) Prior Publication Data

US 2013/0194010 A1 Aug. 1, 2013

(30) Foreign Application Priority Data

Jan. 30, 2012 (JP) ................................. 2012-016790

(51) Int. Cl.
*G05F 1/10* (2006.01)
(52) U.S. Cl.
USPC ............................ 327/544; 327/538; 327/564
(58) Field of Classification Search
CPC .......... G11C 5/14; G11C 5/147; G11C 5/148; H03K 19/0008; H03K 19/0013; H03K 19/0016
USPC .................. 327/530, 538, 543, 544, 564–566
See application file for complete search history.

(56) References Cited

U.S. PATENT DOCUMENTS

| 5,745,375 A | 4/1998 | Reinhardt et al. |
| 6,486,816 B2* | 11/2002 | Seymour ........................ 341/150 |
| 7,667,484 B2* | 2/2010 | Tada ................................ 326/33 |
| 7,782,125 B2 | 8/2010 | Shimura |
| 2010/0165776 A1* | 7/2010 | Tada ............................ 365/226 |
| 2011/0133321 A1 | 6/2011 | Ihara |

FOREIGN PATENT DOCUMENTS

| JP | 2005-250736 A | 9/2005 |
| JP | 2009-200739 A | 9/2009 |
| JP | 2011-119609 A | 6/2011 |

* cited by examiner

*Primary Examiner* — William Hernandez
(74) *Attorney, Agent, or Firm* — McGinn IP Law Group, PLLC

(57) ABSTRACT

A semiconductor integrated circuit includes a logic circuit having a plurality of operation modes, a power source circuit that generates a power source voltage to be supplied to the logic circuit, a power source wiring that couples the power source circuit and the logic circuit, and a charge control block that holds charges for controlling the voltage of the power source wiring. The power source circuit generates a first power source voltage for causing the logic circuit to operate in a computing mode and a second power source voltage for causing the logic circuit to operate in a sleep mode. The charge control block includes a capacitor, a first switch, and a voltage supply unit that supplies the second power source voltage or a third power source voltage lower than the second power source voltage, to the capacitor.

11 Claims, 22 Drawing Sheets

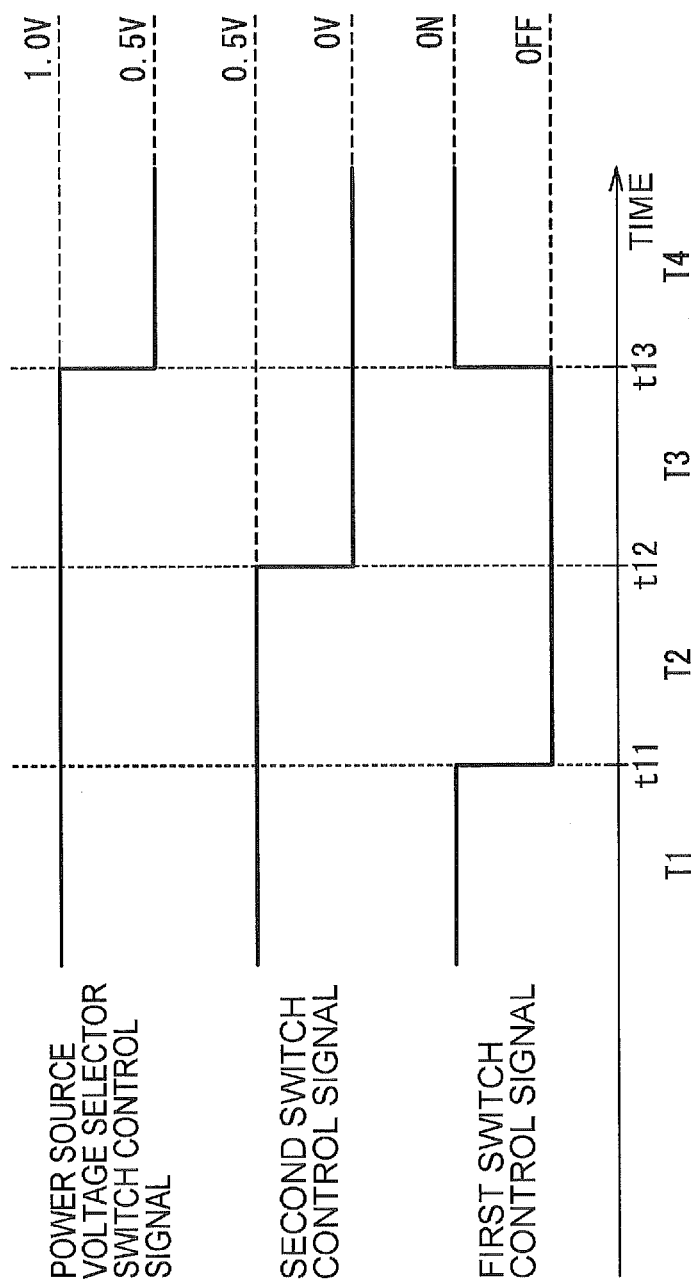

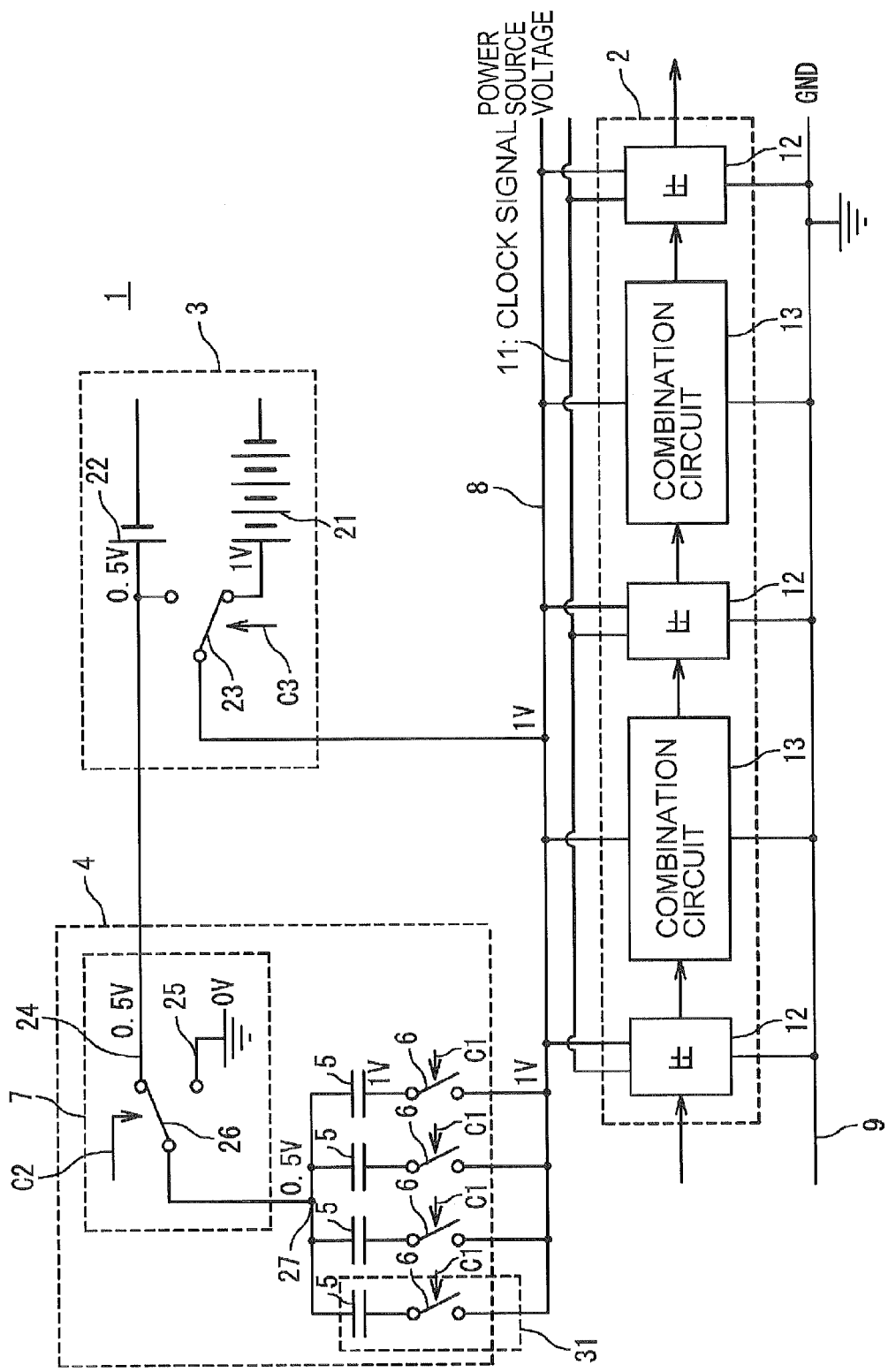

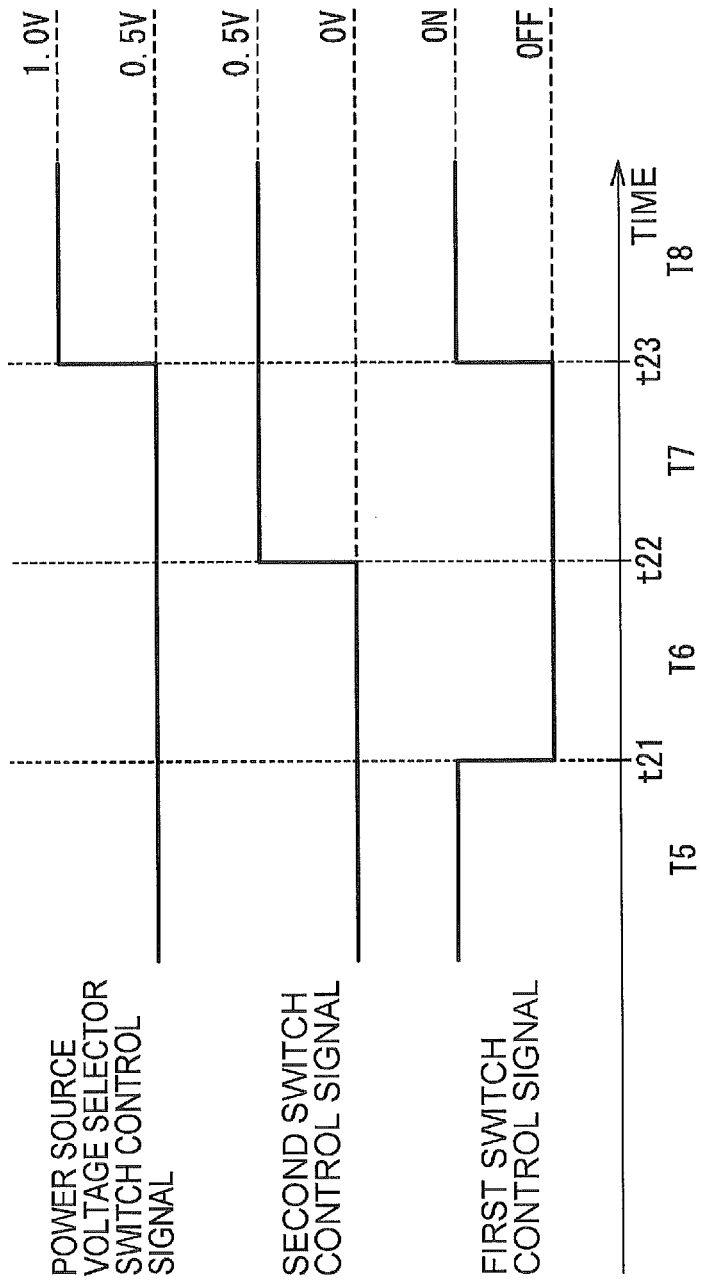

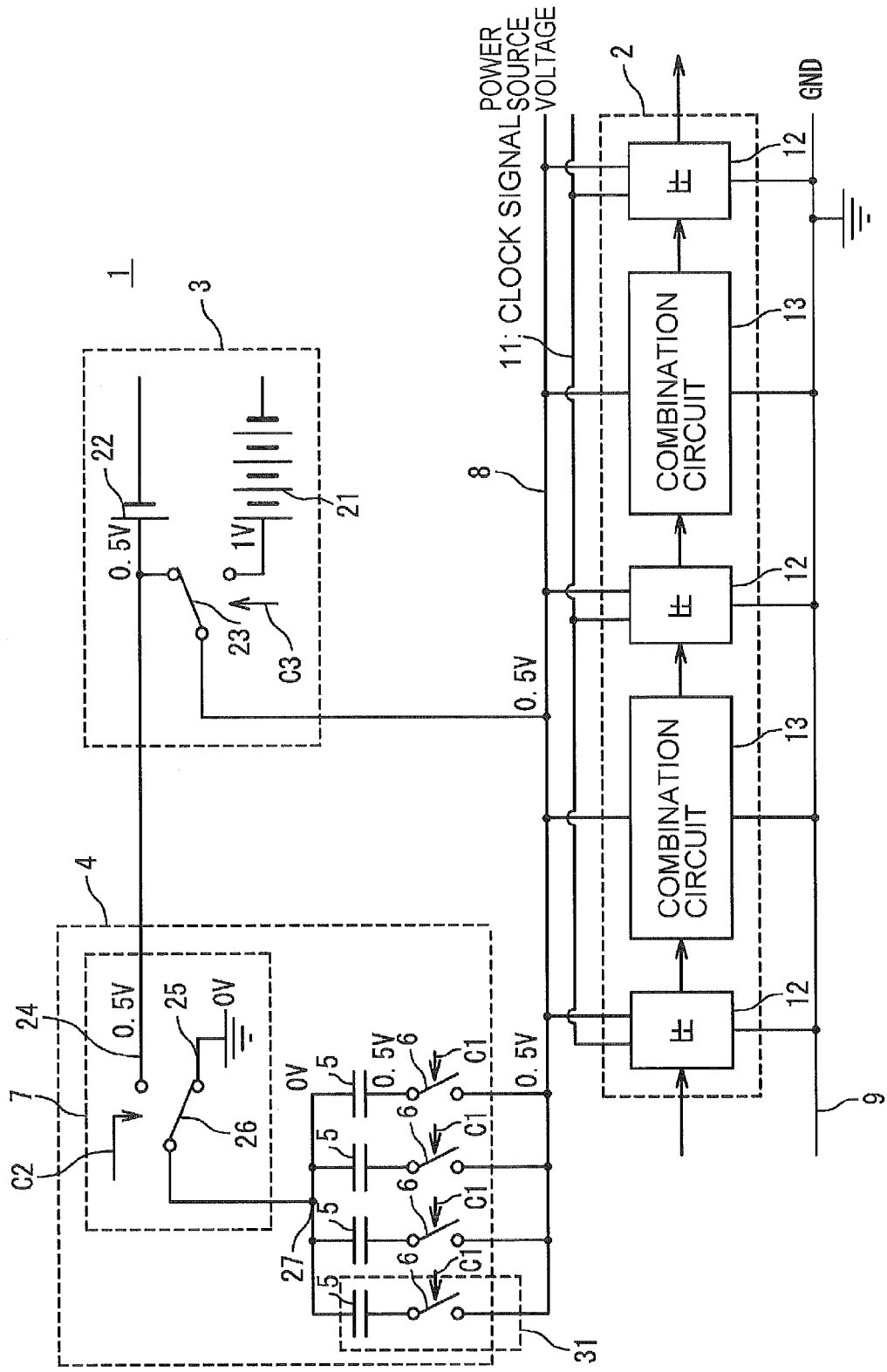

SEMICONDUCTOR INTEGRATED CIRCUIT AND METHOD OF REDUCING POWER CONSUMPTION

CROSS-REFERENCE TO RELATED APPLICATION

The disclosure of Japanese Patent Application No. 2012-016790 filed on Jan. 30, 2012 including the specification, drawings and abstract is incorporated herein by reference in its entirety.

BACKGROUND

The present invention relates to a semiconductor integrated circuit and a method of operating a semiconductor integrated circuit and for example, to a semiconductor integrated circuit that mounts a logic circuit having a computing mode and a sleep mode and a method of operating such a semiconductor integrated circuit.

In order to realize a reduction in power consumption of a semiconductor integrated circuit, semiconductor integrated circuits having applied the DVS (Dynamic Voltage Scaling) technique or the AVS (Adaptive Voltage Scaling) technique are becoming widespread (for example, see U.S. Pat. No. 5,745,375 (Patent Document 1), Japanese Patent Laid-Open No. 2009-200739 (Patent Document 2), Japanese Patent Laid-Open No. 2011-119609 (Patent Document 3), and Japanese Patent Laid-Open No. 2005-250736 (Patent Document 4)).

Patent Document 1 describes a technique relating to a power source control device circuit for reducing power consumption by electronic equipment. The power source control device circuit includes a control device, a clock generation circuit, and a power source circuit. The control device is a power source circuit managed by power management software and the clock generation circuit sets voltage and frequency in accordance with two different states.

Patent Document 2 describes a technique relating to a semiconductor integrated circuit implementing the AVS technique or the DVS technique suitable to a reduction in power consumption. The semiconductor integrated circuit forms a critical path by a first flip-flop, a combination circuit, and a second flip-flop. Furthermore, in the subsequent stage of the combinational circuit, a first delay circuit and a third flip-flop are provided. Similarly, in the subsequent state of the combination circuit, a second delay circuit and a fourth flip-flop are provided. Moreover, there are provided a first comparison circuit that compares the output of the second flip-flop and the output of the third flip-flop, a second comparison circuit that compares the output of the second flip-flop and the output of the fourth flip-flop, and a control circuit that controls a power source voltage to be supplied to the combination circuit in accordance with the outputs of these comparison circuits.

Patent Document 3 describes a technique relating to stabilization of a plurality of power source voltages. Patent Document 4 describes a technique relating to a power control device capable of shortening the transition time when switching power source voltages. The power control device includes a processor chip and a power source voltage generation device that generates variable power source voltages to be supplied to the processor chip. Furthermore, the processor chip includes a power source voltage determination device that selects one of the power source voltages generated by the power source voltage generation device.

SUMMARY

The semiconductor integrated circuit as described above requires much electric power in a fast computing processing mode (for example, the power source voltage is 1 V) in which fast computing by a logic circuit is performed. Furthermore, the semiconductor integrated circuit makes a transition to a sleep mode (for example, the power source voltage is 0.5 V) by reducing electric power to be supplied to the logic circuit when performing no computing. By performing such operations, a semiconductor integrated circuit of a low power consumption system is implemented. Moreover, a semiconductor integrated circuit that requires a short time for transition between two modes is demanded.

Consequently, (1) the power source voltage transition function (for example, from the sleep mode to the fast computing mode) to switch between the fast computing processing mode and the sleep mode in a brief time and (2) the stable power source function robust to noises (in particular, at the time of fast computing mode) become necessary. The fast power source voltage transition function and the stable power source function are contradictory capabilities (fast transition properties (instability) and stability). The circuit function to cause both the capabilities to coexist and the device to implement the circuit function used to be necessary. The problems as described above occur newly along with the development of the semiconductor integrated circuit technique.

In order to solve the above-described problems, it is configured such that a semiconductor integrated circuit includes a logic circuit having a computing mode, which is an operation mode when performing computing, and a sleep mode, which is an operation mode when suspending computing, a power source circuit that generates a power source voltage to be supplied to the logic circuit, a power source wiring that couples the power source circuit and the logic circuit, and a charge control block that holds charges for controlling the voltage of the power source wiring. Here, the power source circuit generates a first power source voltage (1 V) for causing the logic circuit to operate in the computing mode and a second power source voltage (0.5 V) for causing the logic circuit to operate in the sleep mode. Furthermore, the charge control block includes a capacitor, a first switch provided between one end of the capacitor and the power source wiring, and a voltage supply unit that supplies the second power source voltage or a third power source voltage (0 V) lower than the second power source voltage, to the other end of the capacitor.

In the above-mentioned semiconductor integrated circuit, the power source circuit includes a first power source voltage generation circuit that generates a first power source voltage, a second power source voltage generation circuit that generates a second power source voltage, and a power source voltage selector switch that controls the coupling of one of the first power source voltage generation circuit and the second power source voltage generation circuit, and the power source wiring. Furthermore, the voltage supply unit includes a second power source voltage supply node that supplies the second power source voltage (0.5 V), a third power source voltage supply node that supplies the third power source voltage (0 V), and a second switch that is coupled to the other end of the capacitor and that controls the coupling of one of the second power source voltage supply node and the third power source voltage supply node, and the other end. Here, the capacitor functions as a decoupling capacitor that stabilizes the voltage of the power source wiring and at the same time, and functions also as a battery that charges the power source wiring.

To explain briefly the effect acquired by the typical invention among the inventions disclosed in the present application, it is made possible to provide a technique that causes the fast power source voltage transition function and the stable power source function to coexist.

BRIEF DESCRIPTION OF THE DRAWINGS

FIG. 2 is a timing chart illustrating an operation of the semiconductor integrated circuit 1 of the present embodiment;

FIG. 3B is a block diagram illustrating a coupling state of the semiconductor integrated circuit 1;

FIG. 4 is a timing chart illustrating the operation of the semiconductor integrated circuit 1 of the present embodiment;

FIG. 5B is a block diagram illustrating a coupling state of the semiconductor integrated circuit 1;

DETAILED DESCRIPTION

First Embodiment

Figure 1:
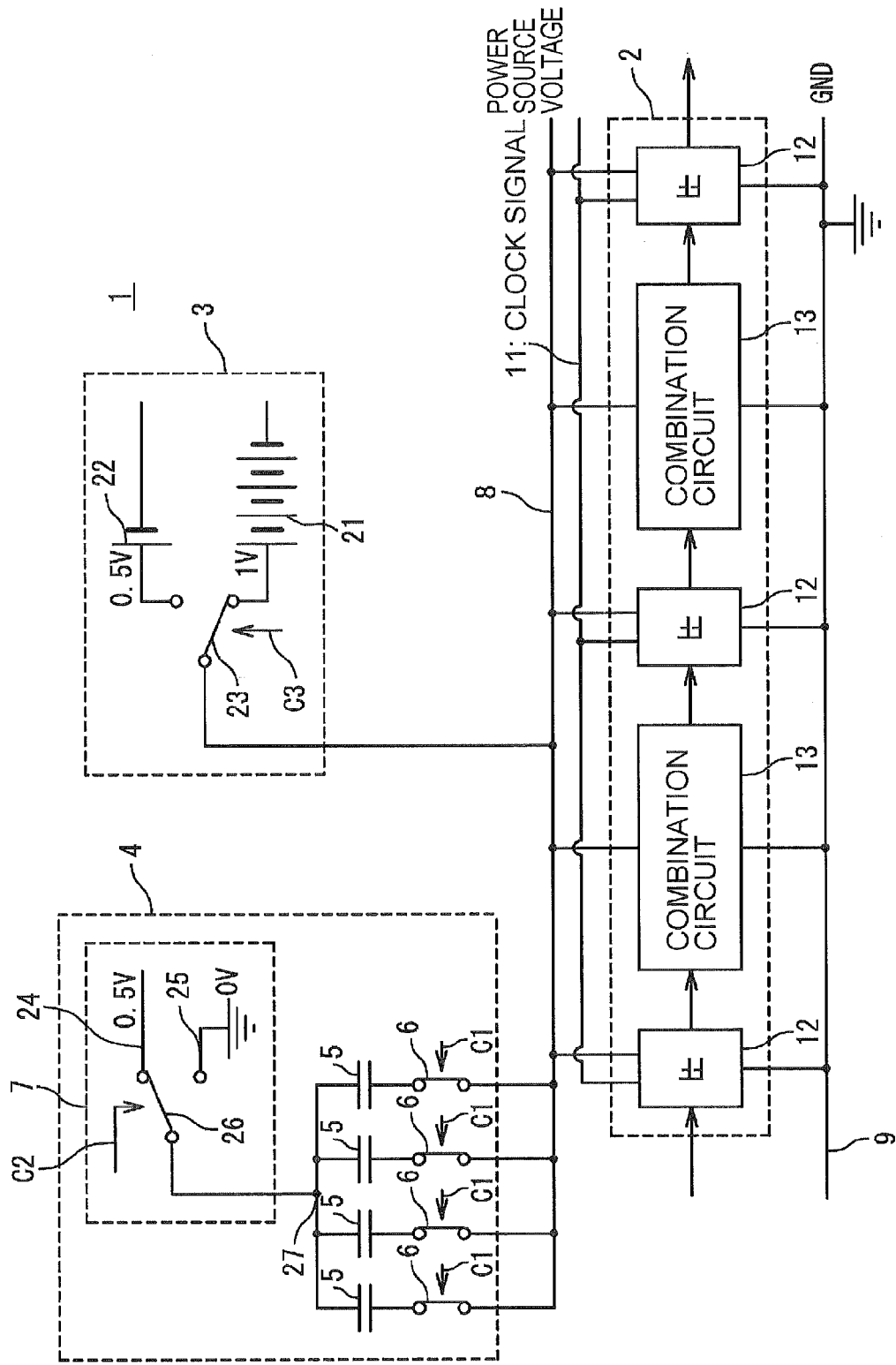
FIG. 1 is a block diagram illustrating a configuration of a semiconductor integrated circuit 1 of a present embodiment.

Hereinafter, an embodiment of the present invention will be explained on the basis of the drawing. In the drawings for explaining embodiments, the same symbol is attached to the same member, as a principle, and the repeated explanation thereof is omitted.

FIG. 1 is a block diagram illustrating a configuration of a semiconductor integrated circuit 1 of the present embodiment. The semiconductor integrated circuit 1 of the present embodiment includes a logic circuit 2, a power source circuit 3, and a charge control block 4. The logic circuit 2 is a circuit block capable of switching between a state where fast computing processing can be performed (hereinafter, described as the fast computing mode) and a state where the computing operation is suspended (hereinafter, described as the sleep mode). The power source circuit 3 generates a voltage necessary for the logic circuit 2 to operate in the fast computing mode and a voltage necessary to operate in the sleep mode. The charge control block 4 is a charge control function block that implements the decoupling capacitor function to stabilize the power source voltage and the charge pump function at the time of power source voltage transition by a single circuit block.

Meanwhile, in the embodiment described below, in order to make understanding of the present embodiment easy, the configuration and operation of the semiconductor integrated circuit 1 when the number of the operation modes of the logic circuit 2 is two (fast computing mode and sleep mode) are illustrated. The configuration and operation do not limit the number of the operation modes in the logic circuit 2 of the present embodiment. Furthermore, a case is illustrated where 1 V is supplied as the power source voltage to the logic circuit 2 of the present embodiment in the fast computing mode and 0.5 V is supplied as the power source voltage in the sleep mode. These voltages are not intended to limit the voltages of the logic circuit 2 in the present embodiment.

Referring to FIG. 1, the logic circuit 2 includes a plurality of flip-flops 12 and a plurality of combination circuits 13. Each of the flip-flops 12 is coupled to a power source wiring 8 that supplies the power source voltage. Furthermore, each of the flip-flops 12 is coupled to a ground wiring 9 that supplies the ground voltage. To each flip-flop 12, a clock signal is supplied via a clock signal supply wiring 11. Similarly, each of the combination circuits 13 is coupled to the power source wiring 8 that supplies the power source voltage. In addition, each of the combination circuits 13 is coupled to the ground wiring 9 that supplies the ground voltage.

The power source wiring 8 is coupled to the power source circuit 3. As described above, the power source circuit 3 of the present embodiment generates a voltage necessary for the logic circuit 2 to operate in the fast computing mode and a voltage necessary to operate in the sleep mode. As shown in FIG. 1, the power source circuit 3 includes a first power source voltage generation circuit 21, a second power source voltage generation circuit 22, and a power source voltage selector switch 23. The first power source voltage generation circuit 21 generates a voltage (1 V) necessary for the logic circuit 2 to operate in the fast computing mode. The second power source voltage generation circuit 22 generates a voltage (0.5 V) necessary for the logic circuit 2 to operate in the sleep mode. The power source voltage selector switch 23 switches the coupling of the power source wiring 8 and the first power source voltage generation circuit 21 or the coupling of the power source wiring 8 and the second power source voltage generation circuit 22, in response to a power source voltage selector switch control signal C3. The power source voltage selector switch 23 couples the power source wiring 8 and the first power source voltage generation circuit 21 when the logic circuit 2 is in the fast computing mode and couples the power source wiring 8 and the second power source voltage generation circuit 22 when the logic circuit 2 is in the sleep mode.

Furthermore, the power source wiring 8 is coupled to the charge control block 4. As described above, the charge control block 4 of the present embodiment implements the decoupling capacitor function to stabilize the power source voltage and the charge pump function at the time of power source voltage transition, by a single circuit block. In other words, the charge control block 4 is configured as a charge control function (adaptive charge tank: ACT) having the charge pump function that accelerates transition of the power source voltage and the decoupling function that stabilizes the power source voltage.

The charge control block 4 includes at least one capacitor unit 5, a charge control first switch 6 that controls the coupling of the capacitor unit 5 and the power source wiring 8, and a voltage supply unit 7. Meanwhile, the charge control block 4 in FIG. 1 includes the four capacitor units 5 and the charge control first switches 6 provided in a one-to-one manner to the capacitor units 5. This configuration is intended to make understanding of the present embodiment easy and not intended to limit the number of the capacitor units 5 and the charge control first switches 6 provided in the charge control block 4.

The capacitor unit 5 is constituted by a miniature MIM capacitor element. The charge control first switch 6 is constituted by a fast MOS switch element. Each of the charge control first switches 6 opens and closes independently in response to a first switch control signal C1 supplied from a control function unit (word driver) of a fast MOS switch, not shown schematically.

The power supply unit 7 includes a second power source voltage supply node 24, a third power source voltage supply node 25, and a charge control second switch 26. The second power source voltage supply node 24 supplies a voltage (0.5 V) necessary for the logic circuit 2 to operate in the sleep mode. The third power source voltage supply node 25 supplies the ground voltage (0 V). The charge control second switch 26 switches the coupling of one end (node 27) of the capacitor unit 5 and the second power source voltage supply node 24 or the coupling of the one end (node 27) of the capacitor unit 5 and the third power source voltage supply node 25, in response to a second switch control signal C2.

In the following, the operation of the semiconductor integrated circuit 1 of the present embodiment will be explained. FIG. 2 is a timing chart illustrating the operation of the semiconductor integrated circuit 1 of the present embodiment. The timing chart of FIG. 2 illustrates the operation when the logic circuit 2 makes a transition from the fast computing mode to the sleep mode. In addition, FIGS. 3A to 3D illustrate the coupling state of the circuit when the logic circuit 2 makes a transition from the fast computing mode to the sleep mode. Meanwhile, in FIGS. 3A to 3D, the second power source voltage supply node 24 of the power supply unit 7 is coupled to the second power source voltage generation circuit 22 of the power source circuit 3. Therefore, it is made possible for the second power source voltage supply node 24 to receive a voltage of 0.5 V from the second power source voltage generation circuit 22.

Here, the charge control first switch 6 of the present embodiment enters the ON state (switch closes) when the first switch control signal C1 is at High level and enters the OFF state (switch opens) when at Low level. In addition, the charge control second switch 26 couples the second power source voltage supply node 24 and the one end (node 27) of the capacitor unit 5 when the second switch control signal C2 is at High level, and couples the third power source voltage supply node 25 and the one end (node 27) of the capacitor unit 5 at Low level. Furthermore, the power source voltage selector switch 23 couples the first power source voltage generation circuit 21 and the power source wiring 8 when the power source voltage selector switch control signal C3 is at High level, and couples the first power source voltage generation circuit 21 and the power source wiring 8 at Low level.

Figure 3A:
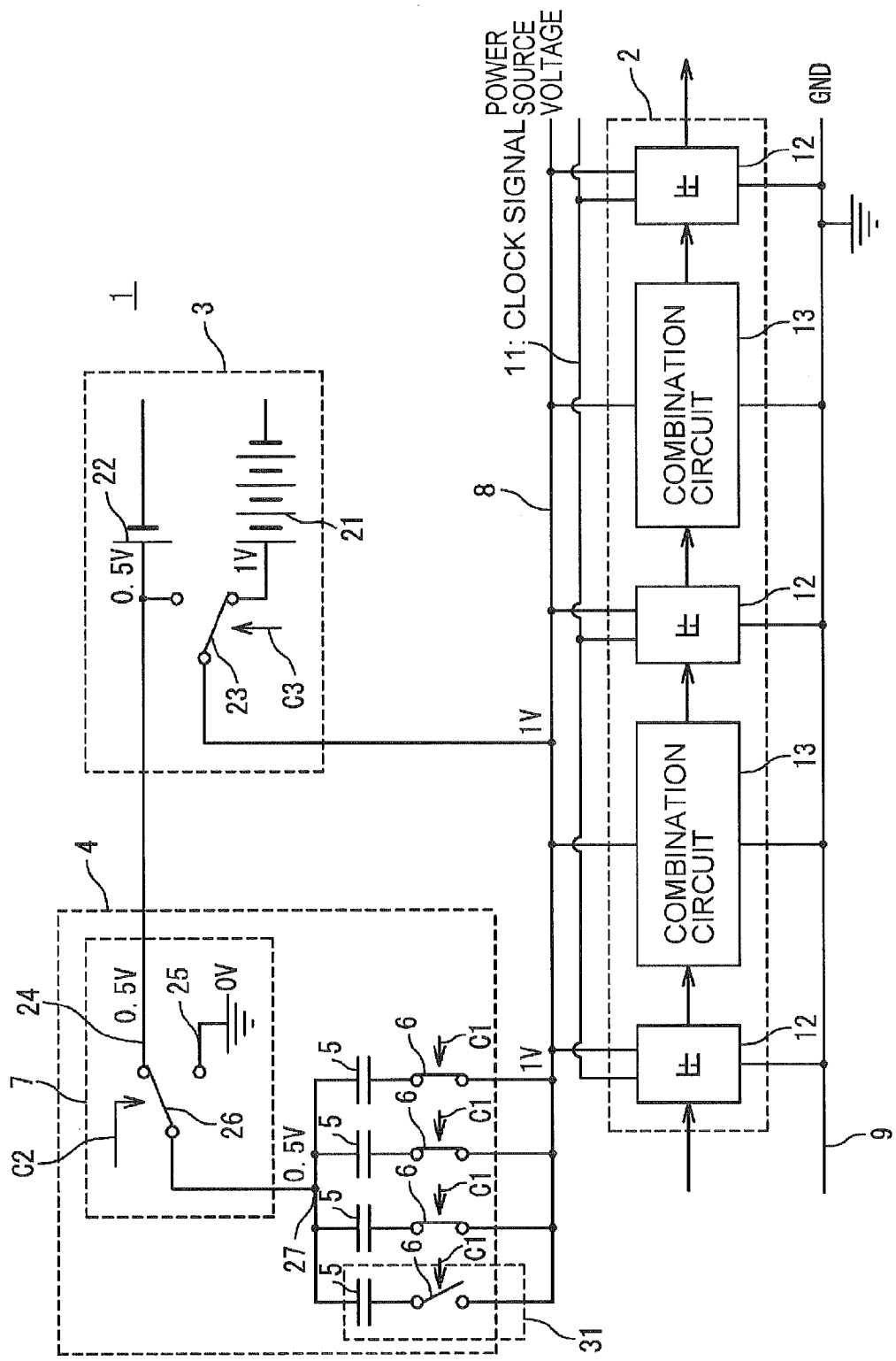
FIG. 3A is a block diagram illustrating a coupling state of the semiconductor integrated circuit 1.

Here, referring to FIG. 2, during a period (first period T1) before time t11, the first switch control signal C1, the second switch control signal C2, and the power source voltage selector switch control signal C3 are all at High level. This enables the operation of the logic circuit 2 in the fast computing mode. FIG. 3A is a block diagram illustrating the coupling state of each circuit of the semiconductor integrated circuit 1 during the first period T1. Meanwhile, as described above, the opening/closing of each of the charge control first switches 6 are controlled independently, and thus, it is possible to make variable the total capacitance of the charge control block 4. In the following embodiment, the operation of the semiconductor integrated circuit 1 will be explained by illustrating a case where the charge control first switch 6 of a capacitor region 31 unused is turned OFF at all times.

Referring to FIG. 3A, in the semiconductor integrated circuit 1 during the first period T1, the charge control first switch 6 of the charge control block 4 couples the capacitor unit 5 and the power source wiring 8 in response to the first switch control signal C1 at High level. Furthermore, the charge control second switch 26 couples the second power source voltage supply node 24 and the one end (node 27) of the capacitor unit 5 in response to the second switch control signal C2 at High level. Moreover, the power source voltage selector switch 23 couples the first power source voltage generation circuit 21 and the power source wiring 8 in response to the first switch control signal C1 at High level.

Due to this, to the power source wiring 8, a power source voltage of 1 V is supplied from the power source circuit 3. The voltage of 1 V is also applied to the electrode on one side of the capacitor unit 5 via the charge control first switch 6. The other (node 27) of the capacitor unit 5 is in the state of being coupled to the second power source voltage supply node 24. At this time, the capacitor unit 5 functions as a decoupling capacitor.

Returning to FIG. 2, at the time t11, the first switch control signal C1 turns from High level to Low level. FIG. 3B is a block diagram illustrating the coupling state of each circuit of the semiconductor integrated circuit 1 during a period (second period T2) after the time t11. During the second period T2, the charge control first switch 6 enters the OFF state in response to the first switch control signal C1 at Low level. As shown in FIG. 3B, by the charge control first switch 6 opening, the electrode of the capacitor unit 5 on the side of the charge control first switch 6 maintains the voltage of 1 V.

Figure 3C:
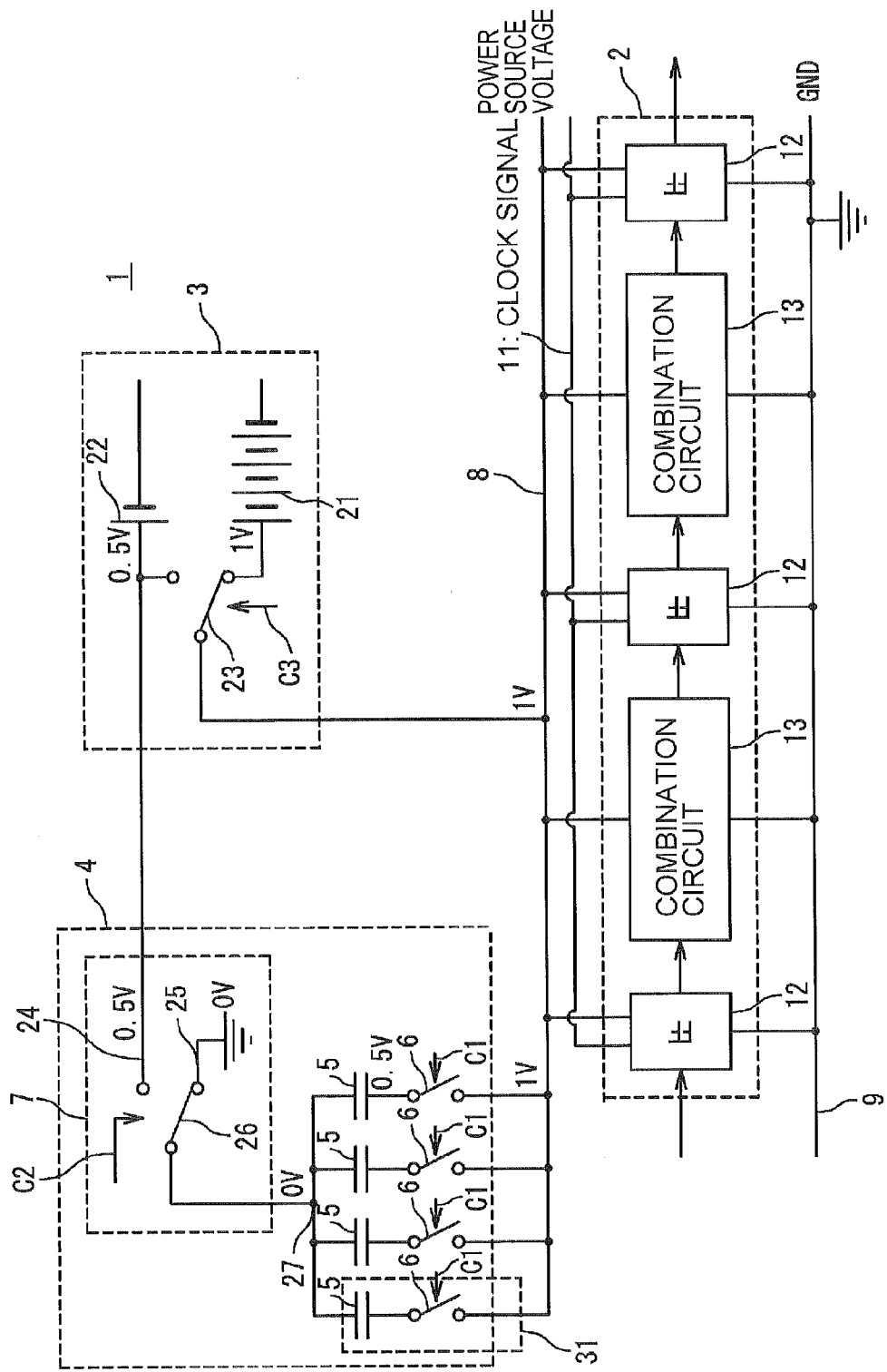
FIG. 3C is a block diagram illustrating a coupling state of the semiconductor integrated circuit 1.

Returning to FIG. 2, at time t12, the second switch control signal C2 turns from High level to Low level. FIG. 3C is a block diagram illustrating the coupling state of each circuit of the semiconductor integrated circuit 1 during a period (third period T3) after the time t12. During the third period T3, 0 V is applied to the one end (node 27) of the capacitor unit 5 in response to the second switch control signal C2 at Low level. By dropping the voltage of the electrode (node 27) of the capacitor unit 5 to 0 V, the electrode on the side of the charge control first switch 6 is lowered to 0.5 V by the charge pump function. Due to this, it is made possible to cause the charge control block 4 to provide a 0.5 V voltage terminal in advance when the logic circuit 2 is in the fast computing mode (1 V operation). After that, when causing the logic circuit 2 to make a transition to the sleep mode, the voltage of the power source wiring 8 is switched to 0.5 V and at the same time, the charge control first switch 6 of the charge control block 4 is brought into the on state.

Figure 3D:
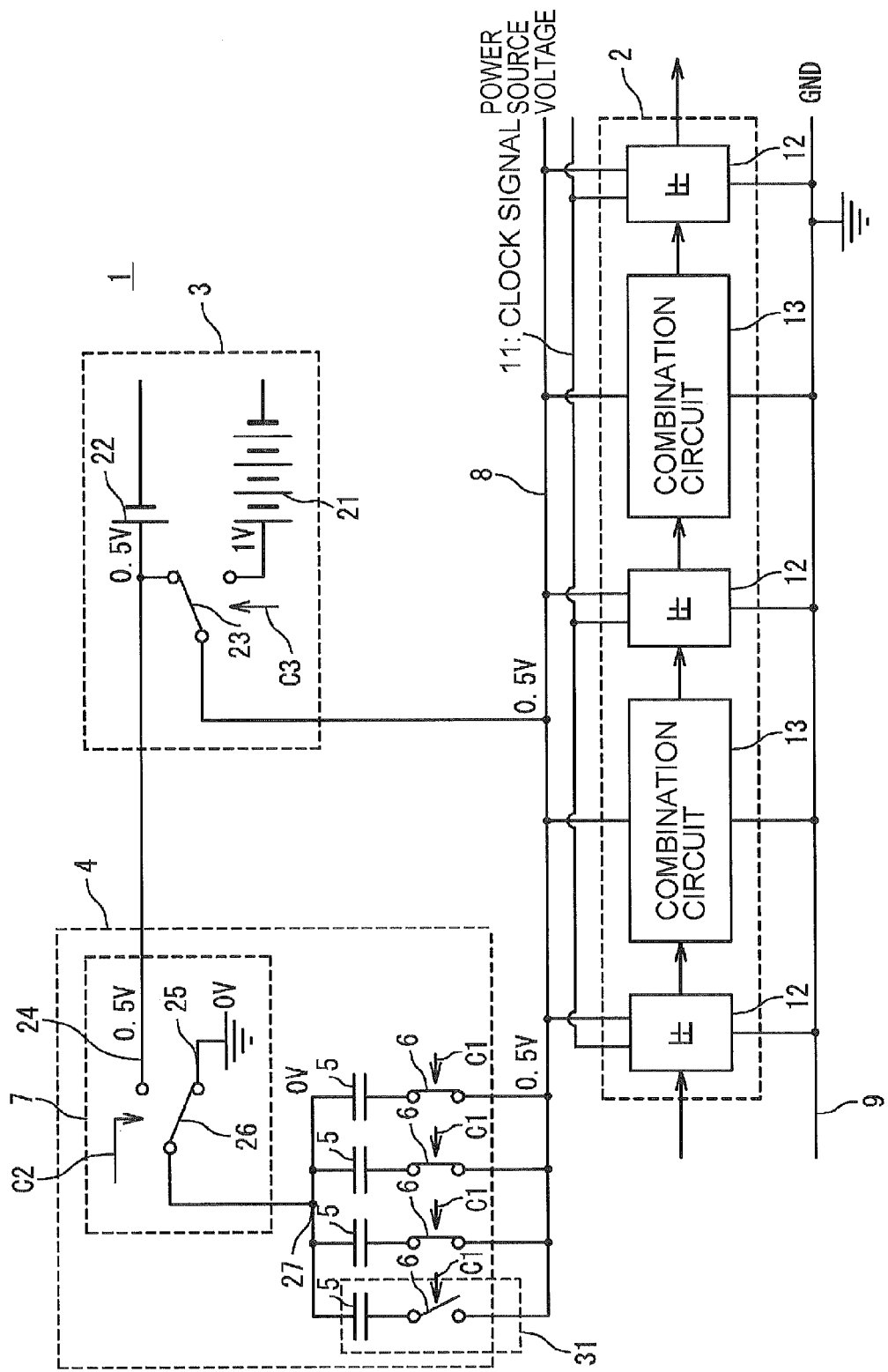
FIG. 3D is a block diagram illustrating a coupling state of the semiconductor integrated circuit 1.

Returning to FIG. 2, at time t13, the power source voltage selector switch control signal C3 turns from High level to Low level. At this time, at the same time as (or a moment after) the turning of the power source voltage selector switch control signal C3, the first switch control signal C1 turns from Low level to High level. FIG. 3D is a block diagram illustrating the coupling state of each circuit of the semiconductor integrated circuit 1 during a period (fourth period T4) after the time t13. During the fourth period T4, the power source voltage selector switch 23 couples the power source wiring 8 and the second power source voltage generation circuit 22 in response to the power source voltage selector switch control signal C3 at Low level. Furthermore, the charge control first switch 6 couples the capacitor unit 5 and the power source wiring 8 in response to the first switch control signal C1 at High level.

At this time, as compared with the voltage transition time from the power source circuit 3 having a large time constant, in the charge control block 4 installed in the vicinity of the logic circuit 2, it is possible to reduce the load (time constant) of the charge pump. Because of that, it is possible to accelerate the voltage transition by the charge pump. After that, the capacitor unit 5 of the charge control block 4 functions as a decoupling capacitor.

FIG. 4 is a timing chart illustrating the operation when the logic circuit 2 makes a transition from the sleep mode to the fast computing mode. FIGS. 5A to 5D illustrate the coupling state of the circuit when the logic circuit 2 makes a transition from the sleep mode to the fast computing mode. Referring to FIG. 4, during a period (fifth period T5) before time t21, the first switch control signal C1 is at High level. The second switch control signal C2 and the power source voltage selector switch control signal C3 are at Low level.

Figure 5A:
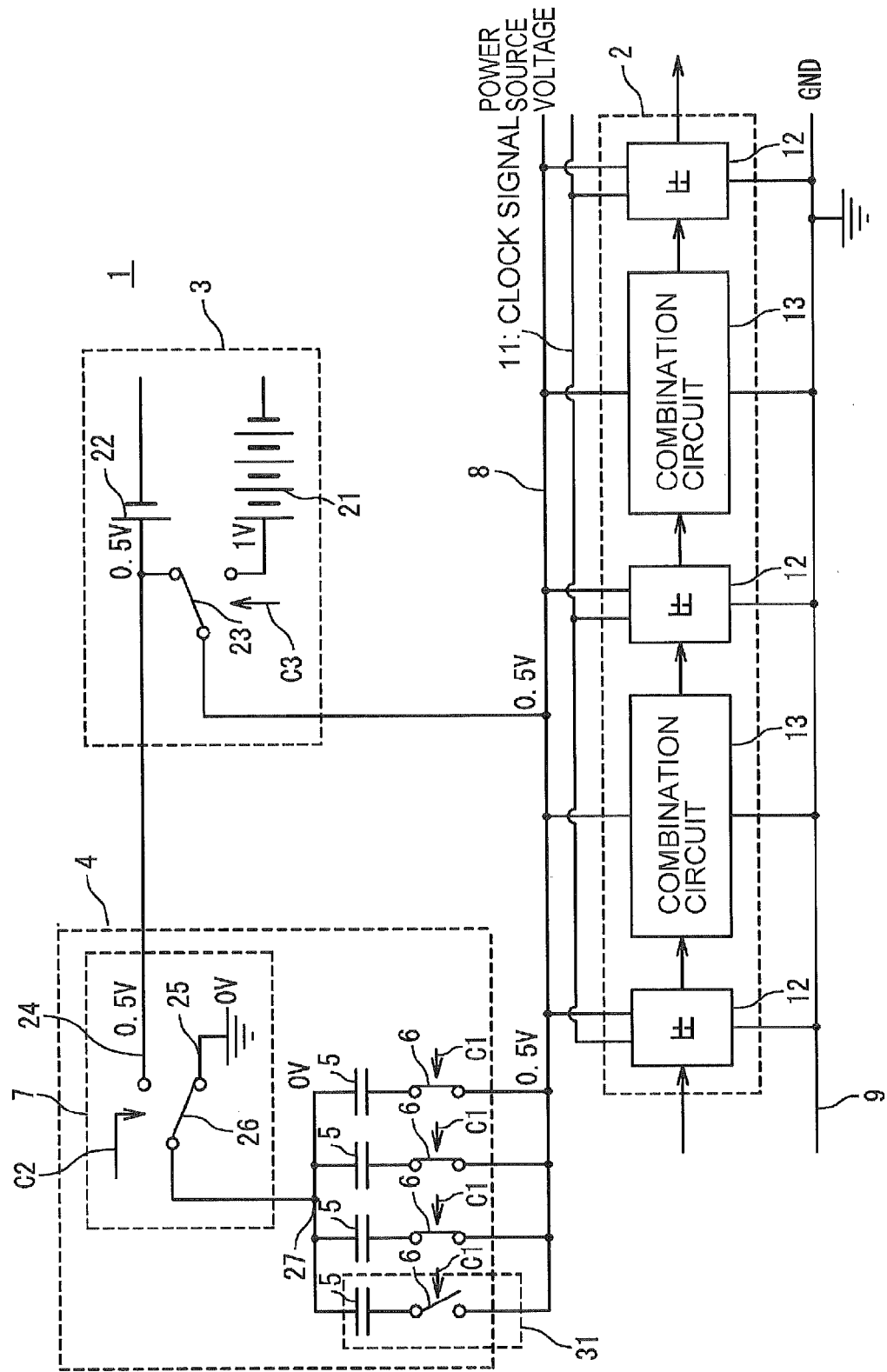
FIG. 5A is a block diagram illustrating a coupling state of the semiconductor integrated circuit 1.

This enables the operation of the logic circuit 2 in the sleep mode. FIG. 5A is a block diagram illustrating the coupling state of each circuit of the semiconductor integrated circuit 1 during the fifth period T5. During the fourth period T4, the power source voltage selector switch 23 couples the power source wiring 8 and the second power source voltage generation circuit 22 in response to the power source voltage selector switch control signal C3 at Low level. Furthermore, the charge control first switch 6 couples the capacitor unit 5 and the power source wiring 8 in response to the first switch control signal C1 at High level. Moreover, the charge control second switch 26 couples the third power source voltage supply node 25 and the one end (node 27) of the capacitor unit 5 in response to the second switch control signal C2 at Low level.

As shown in FIG. 5A, to the power source wiring 8, the power source voltage of 0.5 V is supplied from the power source circuit 3. The voltage of 0.5 V is also applied to the electrode on one side of the capacitor unit 5 via the charge control first switch 6 of the charge control block 4. Furthermore, the other electrode (node 27) of the capacitor unit 5 is in a state of being coupled to the third power source voltage supply node 25 (0 V power source). At this time, the capacitor unit 5 of the charge control block 4 functions as a decoupling capacitor.

Returning to FIG. 4, at the time t21, the first switch control signal C1 makes a transition from High level to Low level. FIG. 5B is a block diagram illustrating the coupling state of each circuit of the semiconductor integrated circuit 1 during a period (sixth period T6) after the time t21. During the sixth period T6, in response to the first switch control signal C1 at Low level, the charge control first switch 6 enters the OFF state. As shown in FIG. 5B, by the opening of the charge control first switch 6, the electrode of the capacitor unit 5 on the side of the charge control first switch 6 maintains the voltage of 0.5 V.

Figure 5C:
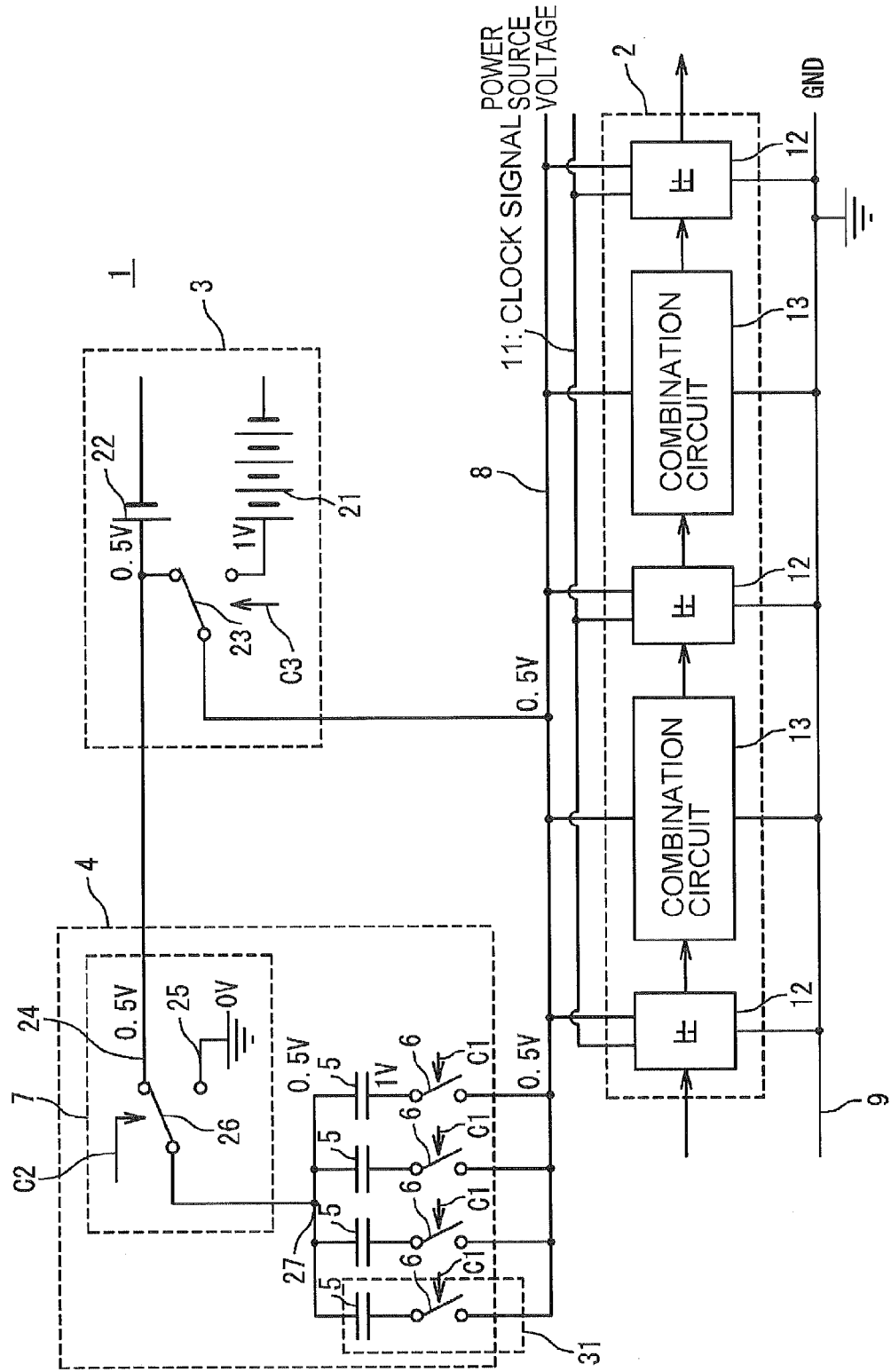
FIG. 5C is a block diagram illustrating a coupling state of the semiconductor integrated circuit 1.

Returning to FIG. 4, at time t22, the second switch control signal C2 makes a transition from Low level to High level. FIG. 5C is a block diagram illustrating the coupling state of each circuit of the semiconductor integrated circuit 1 during a period (seventh period T7) after the time t22. During the seventh period T7, in response to the second switch control signal C2 at High level, 0.5 V is applied to the one end (node 27) of the capacitor unit 5. By switching the electrode (node 27) of the capacitor unit 5 from 0 V to 0.5 V, the electrode on the side of the charge control first switch 6 of the capacitor unit 5 is stepped up to 1.0 V by the charge pump function.

Due to this, it is made possible to cause the charge control block 4 to provide a 1 V voltage terminal in advance necessary for the fast computing mode when the logic circuit 2 is in the sleep mode (0.5 V operation). After that, when causing the logic circuit 2 to make a transition to the fast computing mode, the voltage of the power source wiring 8 is switched to 1 V and at the same time, the charge control first switch 6 of the charge control block 4 is put into the on state.

Returning to FIG. 4, at time t23, the power source voltage selector switch control signal C3 makes a transition from Low level to High level. At this time, at the same time as (or a moment after) the turning of the power source voltage selector switch control signal C3, the first switch control signal C1 turns from Low level to High level.

Figure 5D:
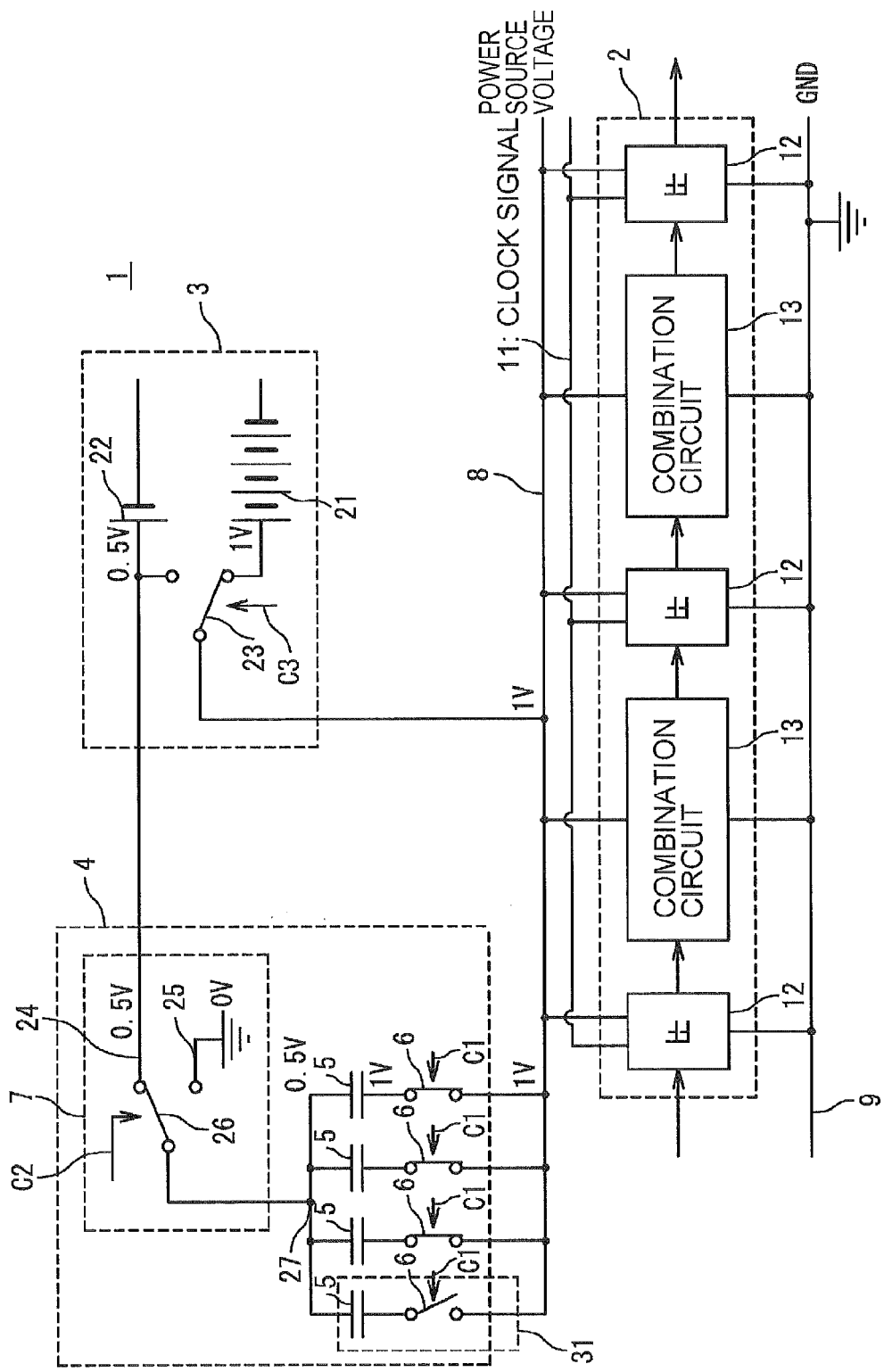
FIG. 5D is a block diagram illustrating a coupling state of the semiconductor integrated circuit 1.

FIG. 5D is a block diagram illustrating the coupling state of each circuit of the semiconductor integrated circuit 1 during a period (eighth period T8) after the time t23. During the eighth period T8, in response to the power source voltage selector switch control signal C3 at High level, the power source voltage selector switch 23 couples the power source wiring 8 and the first power source voltage generation circuit 21. Furthermore, the charge control first switch 6 couples the capacitor unit 5 and the power source wiring 8 in response to the first switch control signal C1 at High level.

At this time, in the same manner as in the operation when the logic circuit 2 makes a transition from the fast computing mode to the sleep mode, as compared with the power source voltage, it is possible to reduce the load (time constant) of the charge pump. Therefore, it is possible to accelerate the voltage transition by the charge pump. After that, the capacitor unit 5 of the charge control block 4 functions as a decoupling capacitor.

Meanwhile, a case is illustrated, where in the capacitor unit 5 of the embodiment described above, the electrode (node 27) on the side opposite to the charge control first switch 6 is switched from the ground (0 V) to 0.5 V. If the node 27 is switched to, for example, 1.0 V, it is possible to set the electrode on the side of the charge control first switch 6 of the capacitor unit 5, to a voltage of 1.5 V. In this case, it is made possible to more quickly step up the power source wiring. It is possible to determine the voltage of the electrode on the side of the charge control first switch 6 of the capacitor unit 5, by the transition time spent for the change of the power source voltage, the capacitance (total capacitance) of the capacitor unit 5 of the charge control block 4, and the voltage transition time constant (multiplication of parasitic capacitance and parasitic resistance) of the power source wiring 8 coupled to the logic circuit 2.

Figure 6:
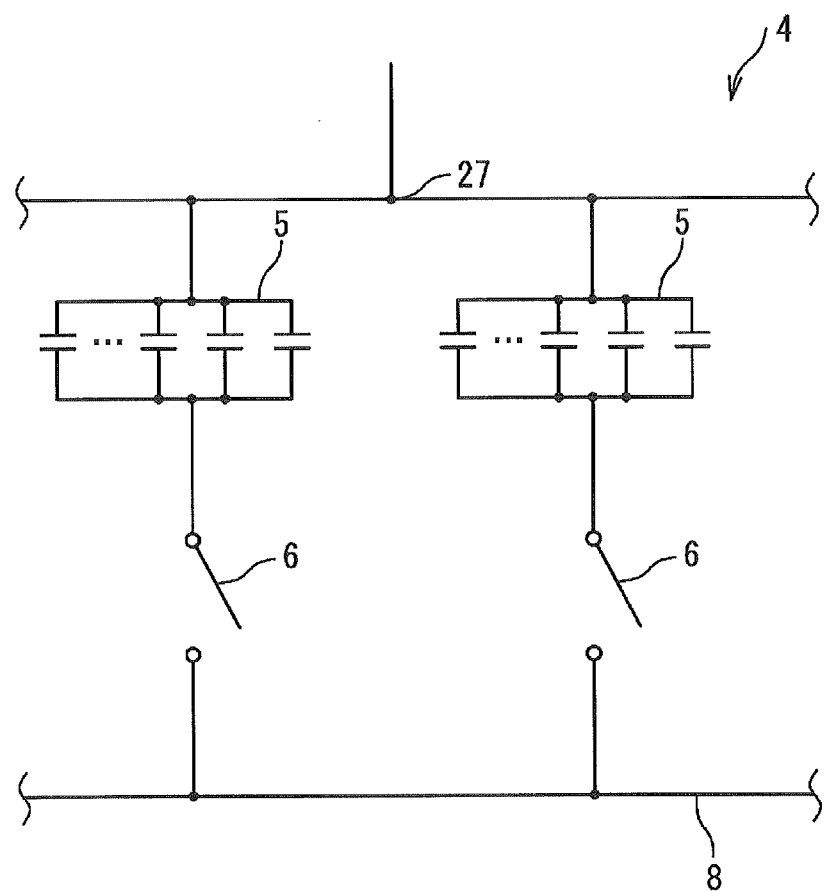
FIG. 6 is a circuit diagram illustrating another configuration of a capacitor unit 5.

As described above, the charge control block 4 includes the capacitor unit 5 constituted by the MIM capacitor element and the charge control first switch 6 constituted by the MOS switch element. It is also possible to configure the capacitor unit 5 so as to have a configuration in which a plurality of miniature capacitor cells is arrayed. FIG. 6 is a circuit diagram illustrating another configuration of the capacitor unit 5 of the charge control block 4 in the semiconductor integrated circuit 1 of the present embodiment. The charge control block 4 shown in FIG. 6 includes the capacitor unit 5 with another configuration. A plurality of the capacitor units 5 with another configuration is arranged in the charge control block 4. Each of the capacitor units 5 is further configured as a composite capacitor in which the arbitrary number of miniature capacitor elements is coupled. It is possible to arbitrarily set the capacitance of the charge control block 4 by controlling the opening/closing of the switch of the capacitor unit 5 having the arbitrary number of miniature capacitor elements.

For example, in general, the transition width of the power source voltage of the logic circuit 2 is different depending on product in many cases. It is possible to variably change the capacitance of the charge control block 4 of the present embodiment and it is only required to control the state of the charge control first switch 6 to change the capacitance. Because of this, it is made possible to apply to the various kinds of the logic circuit 2 having different specifications.

Furthermore, in the embodiment described above, the operation to couple all the charge control first switches 6 of the charge control block 4 to the power source wiring 8 on the side of the logic circuit 2 at the same time is illustrated for the sake of convenience. The operation is not limited to the above, and for example, when it is desired to suppress the power source noises by the simultaneous switching, it is also possible to sequentially close or open each charge control first switch 6 at regular time intervals.

Figure 7:
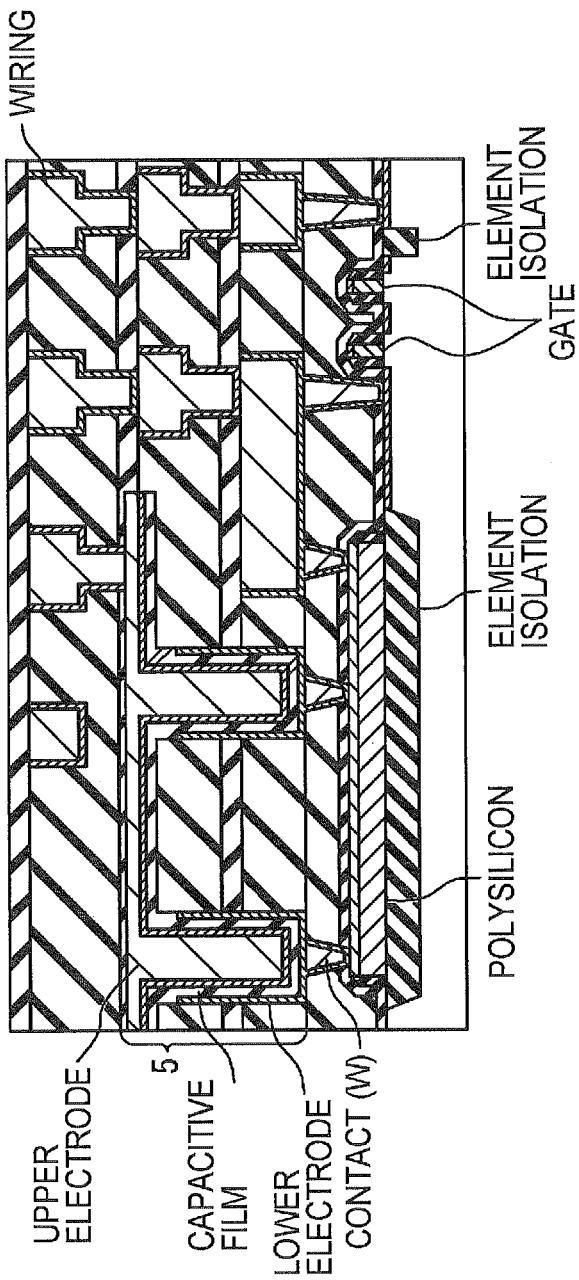
FIG. 7 is a cross-sectional view illustrating a device structure of the capacitor unit 5.

In the following, the structure of the capacitor unit 5 of the present embodiment will be explained. FIG. 7 is a cross-sectional view illustrating the device structure of the capacitor unit 5 of the charge control block 4. As shown in FIG. 7, the semiconductor integrated circuit 1 includes a multilayer wiring layer having a plurality of wirings. The capacitor unit 5 is constituted by the MIM cylinder capacitor provided in the multilayer wiring layer. The MIM cylinder capacitor configures a capacitor element by passing through at least two wiring layers. The capacitor unit 5 shown in FIG. 7 includes two MIM cylinder capacitors arranged in parallel.

The capacitor unit 5 includes an upper electrode, a lower electrode, and a capacitive film. The lower electrode of the capacitor unit 5 is coupled to the polysilicon, the same material as that of the gate electrode of the MOS transistor, via the contact. The polysilicon is provided over the element isolation. The lower electrode of the capacitor unit 5 is coupled to the power source wiring 8 (not shown schematically) of the logic circuit 2 (not shown schematically) via the MOS switch (MOSFET). To the capacitor plate electrode, which is the upper electrode of the MIM cylinder capacitor, 0.5 V or 0 V is applied via the charge control second switch 26, not shown schematically. It is possible for the capacitor unit 5 shown in FIG. 7 to suppress diffusion layer leak because the lower electrode is not coupled electrically to the silicon substrate.

Figure 8:
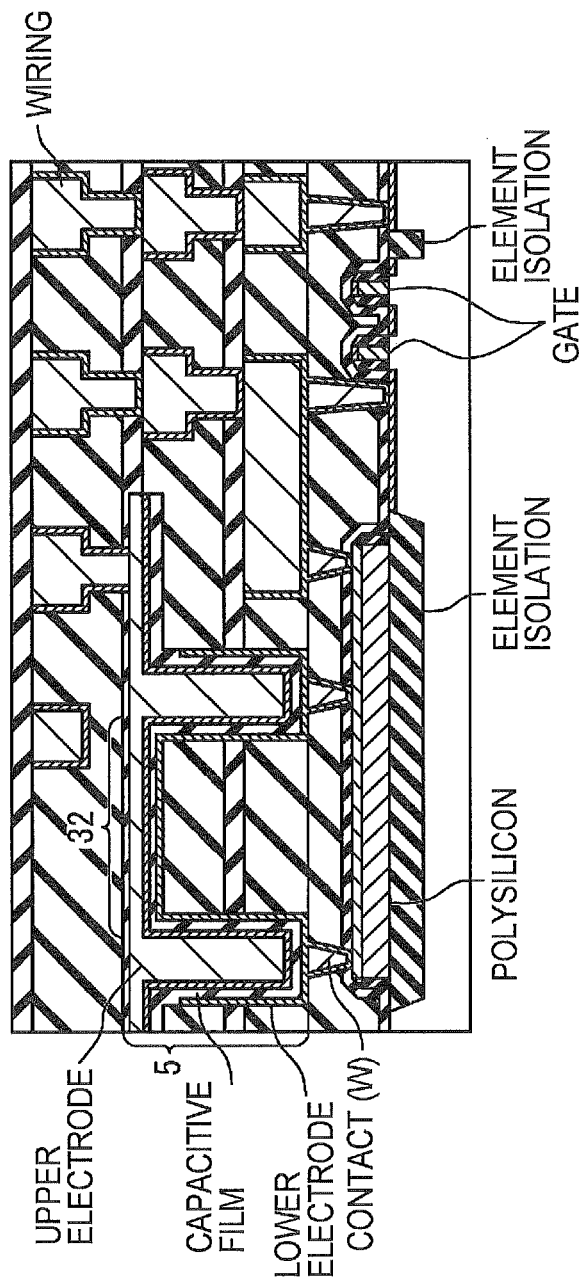
FIG. 8 is a cross-sectional view illustrating a device structure of the capacitor unit 5.

FIG. 8 is a cross-sectional view illustrating another configuration of the device structure of the capacitor unit 5. As shown in FIG. 8, the capacitor unit 5 includes a common coupling region 32. The common coupling region 32 couples in common the lower electrodes of the two neighboring MIM cylinder capacitors. With this structure, the electrode area increases, and thus it is possible to configure the capacitor unit 5 with a high capacitance density.

Figure 9:
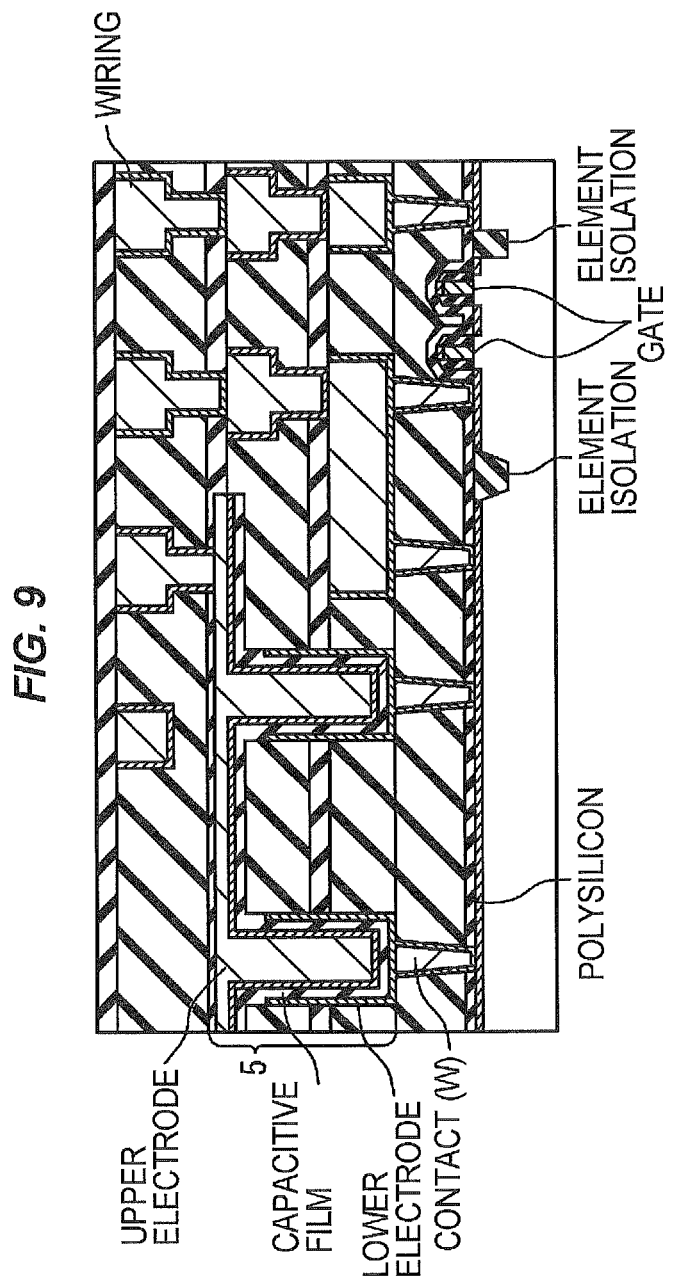
FIG. 9 is a cross-sectional view illustrating a device structure of the capacitor unit 5.

FIG. 9 is a cross-sectional view illustrating another configuration of the device structure of the capacitor unit 5. As shown in FIG. 9, the lower electrode of the capacitor unit 5 is coupled to the silicon substrate via the contact. With this structure, it is made possible to simplify the capacitor unit 5.

Figure 10:
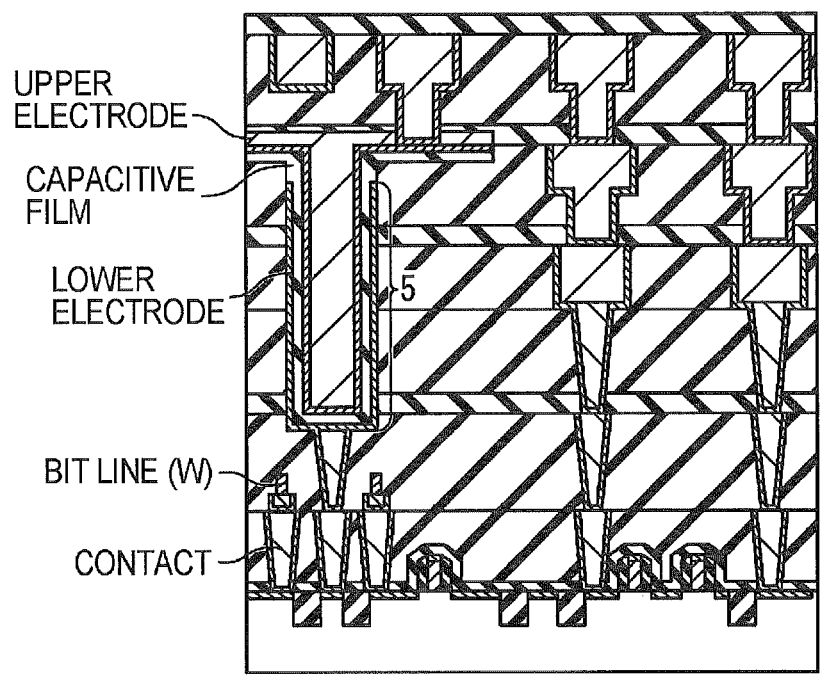
FIG. 10 is a cross-sectional view illustrating a device structure of the capacitor unit 5.

FIG. 10 is a cross-sectional view illustrating another configuration of the device structure of the capacitor unit 5. As shown in FIG. 10, the capacitor unit 5 is provided in the wiring layer including a bit line. When the bit line is coupled to the power source wiring 8 of the logic circuit 2, it may also be possible for the capacitor unit 5 to be coupled to the bit line via the MOS switch (MOSFET). In that case, it is preferable for the MOS switch to be controlled by a word line driver (not shown schematically) in turning on and off.

Figure 11:
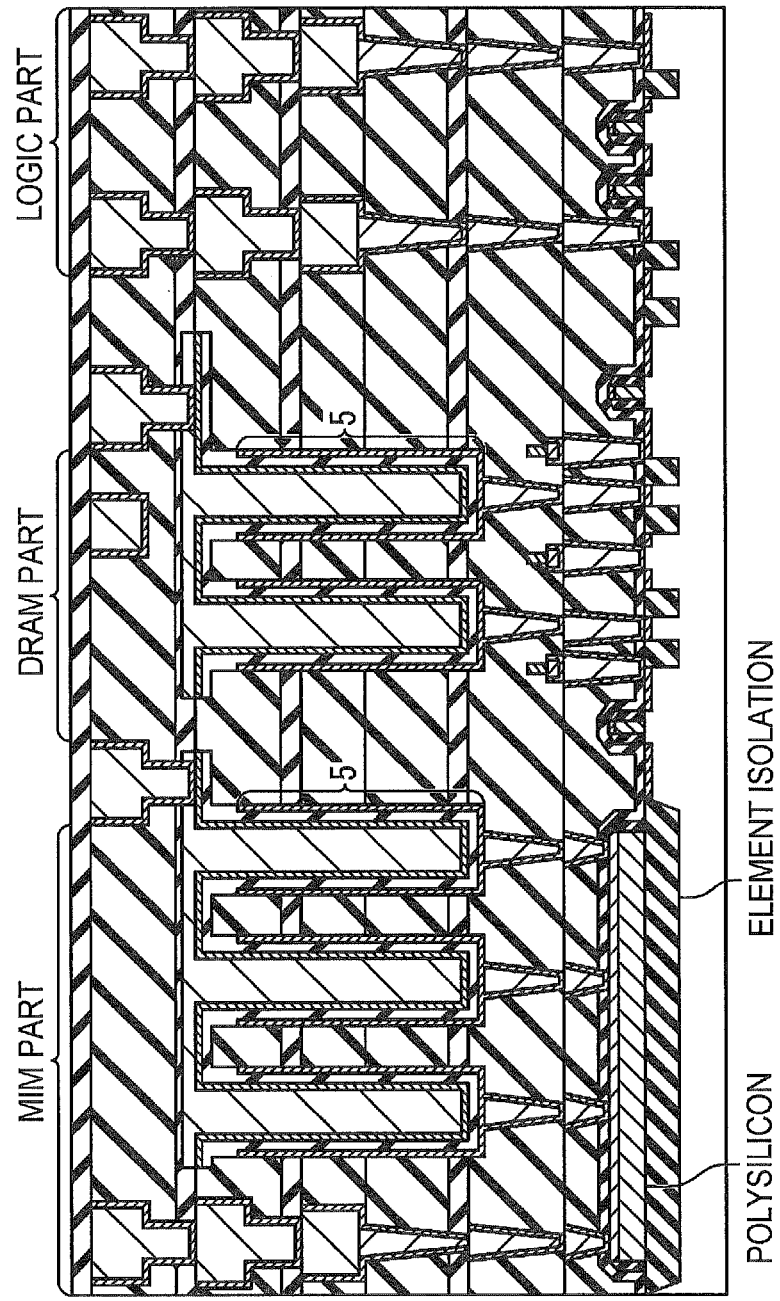
FIG. 11 is a cross-sectional view illustrating a device structure of the capacitor unit 5.

FIG. 11 is a cross-sectional view illustrating another configuration of the device structure of the capacitor unit 5. The semiconductor integrated circuit 1 illustrated in FIG. 11 includes a logic part, a DRAM part, and a MIM part. As shown in FIG. 11, apart of the capacitor unit 5 is provided in the DRAM part. The capacitor unit 5 provided in the MIM part is constituted by a plurality of MIM cylinder capacitors coupled in parallel via polysilicon.

Figure 12:
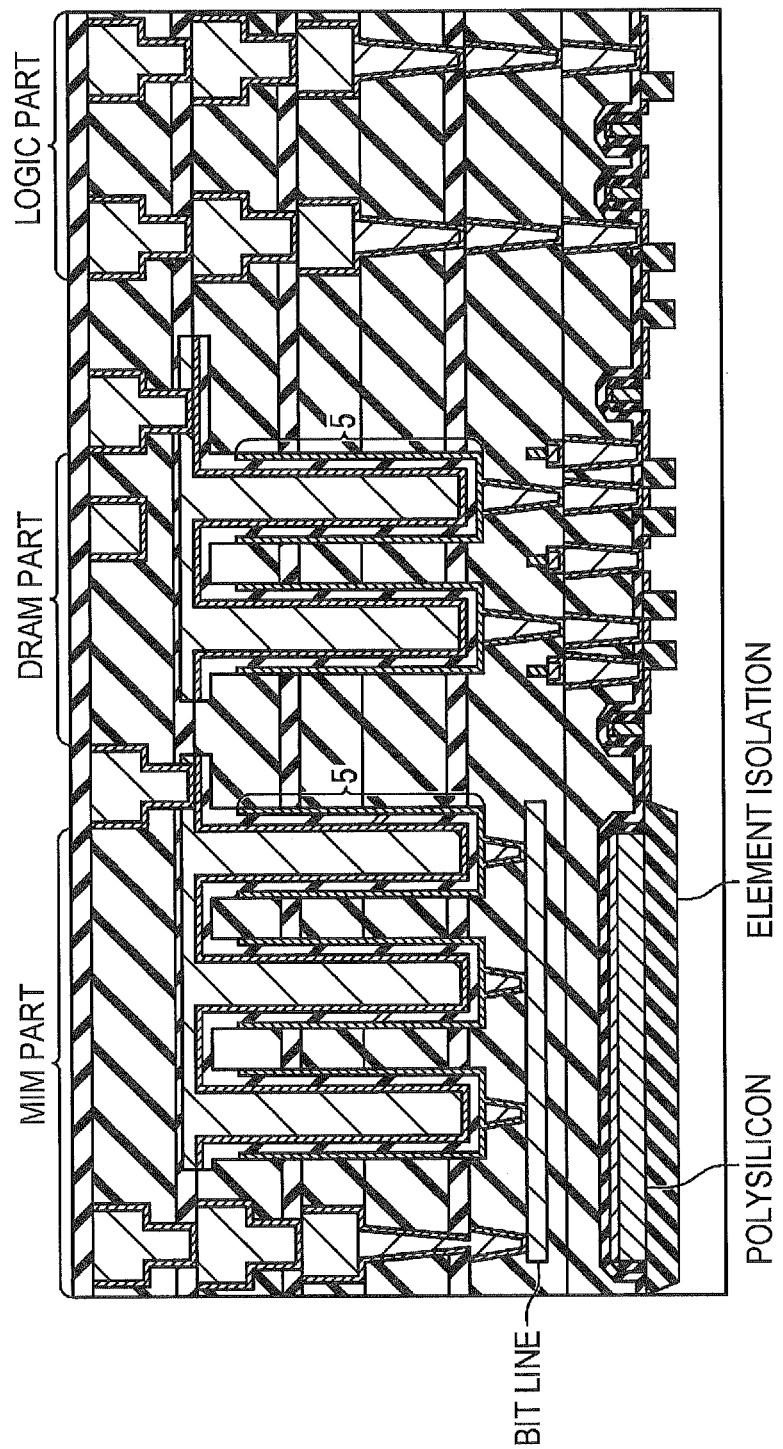
FIG. 12 is a cross-sectional view illustrating a device structure of the capacitor unit 5.

FIG. 12 is a cross-sectional view illustrating another configuration of the device structure of the capacitor unit 5. As in FIG. 11, the semiconductor integrated circuit 1 illustrated in FIG. 12 includes a logic part, a DRAM part, and a MIM part. As shown in FIG. 12, a part of the capacitor unit 5 is provided in the DRAM part. The capacitor unit 5 provided in the MIM part is constituted by a plurality of MIM cylinder capacitors coupled in parallel via a bit line.

Figure 13:
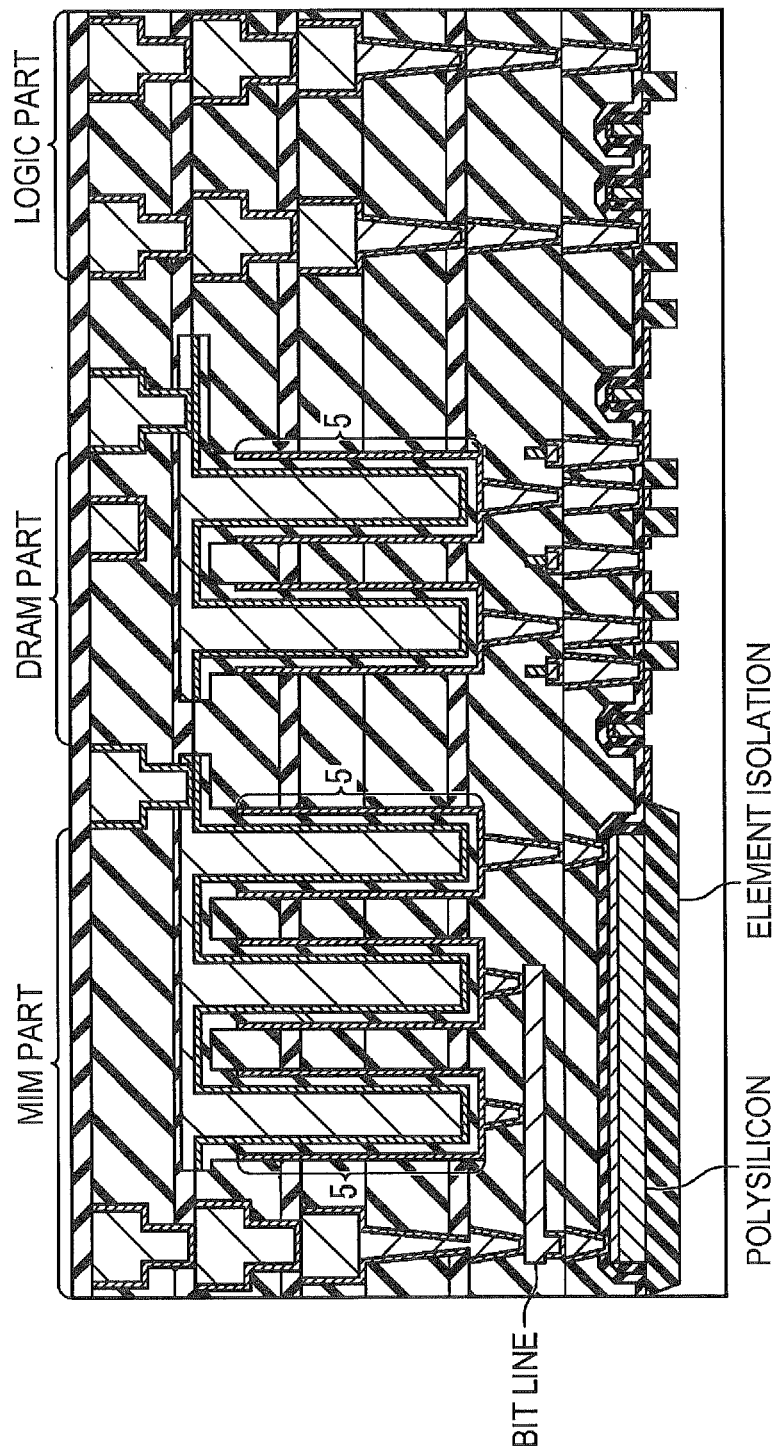
FIG. 13 is a cross-sectional view illustrating a device structure of the capacitor unit 5.

FIG. 13 is a cross-sectional view illustrating another configuration of the device structure of the capacitor unit 5. As in FIG. 11 or FIG. 12, the semiconductor integrated circuit 1 illustrated in FIG. 13 includes a logic part, a DRAM part, and a MIM part. As shown in FIG. 13, a part of the capacitor unit 5 is provided in the DARM part. The capacitor unit 5 provided in the MIM part is constituted by a plurality of MIM cylinder capacitors coupled in parallel via a bit line and the MIM cylinder capacitor coupled to polysilicon.

Second Embodiment

In the following, a second embodiment of the present application will be explained. In the semiconductor integrated circuit 1 of the second embodiment, a part of the charge control block 4 functions as a decoupling capacitor and another part functions as a supply terminal of the transition voltage when the power source voltages of the logic circuit 2 are 1.0 V (fast operation) and 0.5 V (sleep). In the following, in order to make understanding of the present embodiment easy, a case will be explained in detail, where the logic circuit 2 operating in the sleep mode at 0.5 V is stepped up to the fast mode (1.0 V).

Figure 14:
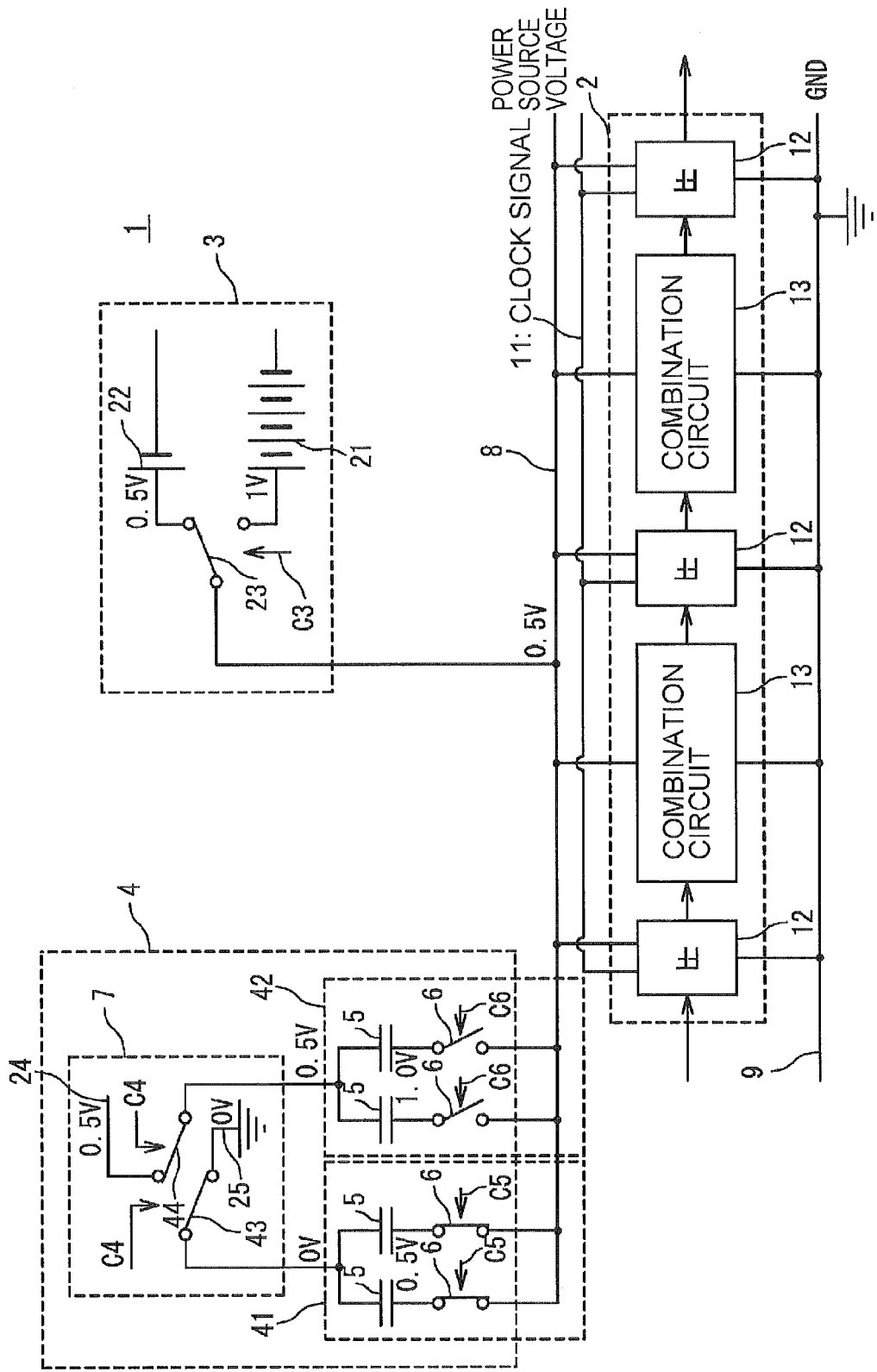
FIG. 14 is a block diagram illustrating a configuration of a second embodiment of the semiconductor integrated circuit 1.

FIG. 14 is a block diagram illustrating a configuration of the second embodiment of the semiconductor integrated circuit 1 of the present application. In the semiconductor integrated circuit 1 of the second embodiment, the charge control block 4 includes a charge control block first region 41 and a charge control block second region 42. The voltage supply part 7 of the charge control block 4 includes the second power source voltage supply node 24, the third power source voltage supply node 25, a first region side switch 43, and a second region side switch 44.

The charge control block first region 41 includes one of the two groups into which the capacitor units 5 within the charge control block 4 are divided. The charge control first switch 6 provided in the charge control block first region 41 opens and closes in response to a first region side first switch control signal C5. The charge control block second region 42 includes the other of the two groups into which the capacitor units 5 are divided. The charge control first switch 6 provided in the charge control block second region 42 opens and closes in response to the first region side first switch control signal C5.

The first region side switch 43 of the voltage supply unit 7 couples the charge control block first region 41 to one of the second power source voltage supply node 24 and the third power source voltage supply node 25 in response to a second switch control signal C4. The second region side switch 44 couples the charge control block second region 42 to one of the second power source voltage supply node 24 and the third power source voltage supply node 25 in response to the second switch control signal C4.

The logic circuit 2 shown in FIG. 14 is operating in the sleep mode. In the semiconductor integrated circuit 1 of the second embodiment, the logic circuit 2 receives a power source of 0.5 V supplied from the power source circuit 3 via the power source wiring 8 when operating in the sleep mode.

At this time, as shown in FIG. 14, the capacitor unit 5 of the charge control block first region 41 of the charge control block 4 is coupled to the power source wiring 8 via the charge control first switch 6. The electrode on the side opposite to the charge control first switch 6 of the capacitor unit 5 of the charge control block first region 41 is coupled to the third power source voltage supply node 25 via the first region side switch 43. That is, the capacitor unit 5 of the charge control block first region 41 acts as a decoupling capacitor for the power source wiring 8 (0.5 V power source wiring).

In contrast, the charge control first switch 6 coupled to the capacitor unit 5 of the charge control block second region 42 is in the open state. Because the charge control block second region 42 has functioned as the charge pump, the electrode on the side of the charge control first switch 6 of the capacitor unit 5 maintains the voltage of 1 V and the electrode on the opposite side has the voltage of 0.5 V. In this state, the charge control block second region 42 is in the standby mode of the 1 V power source terminal.

Figure 15:
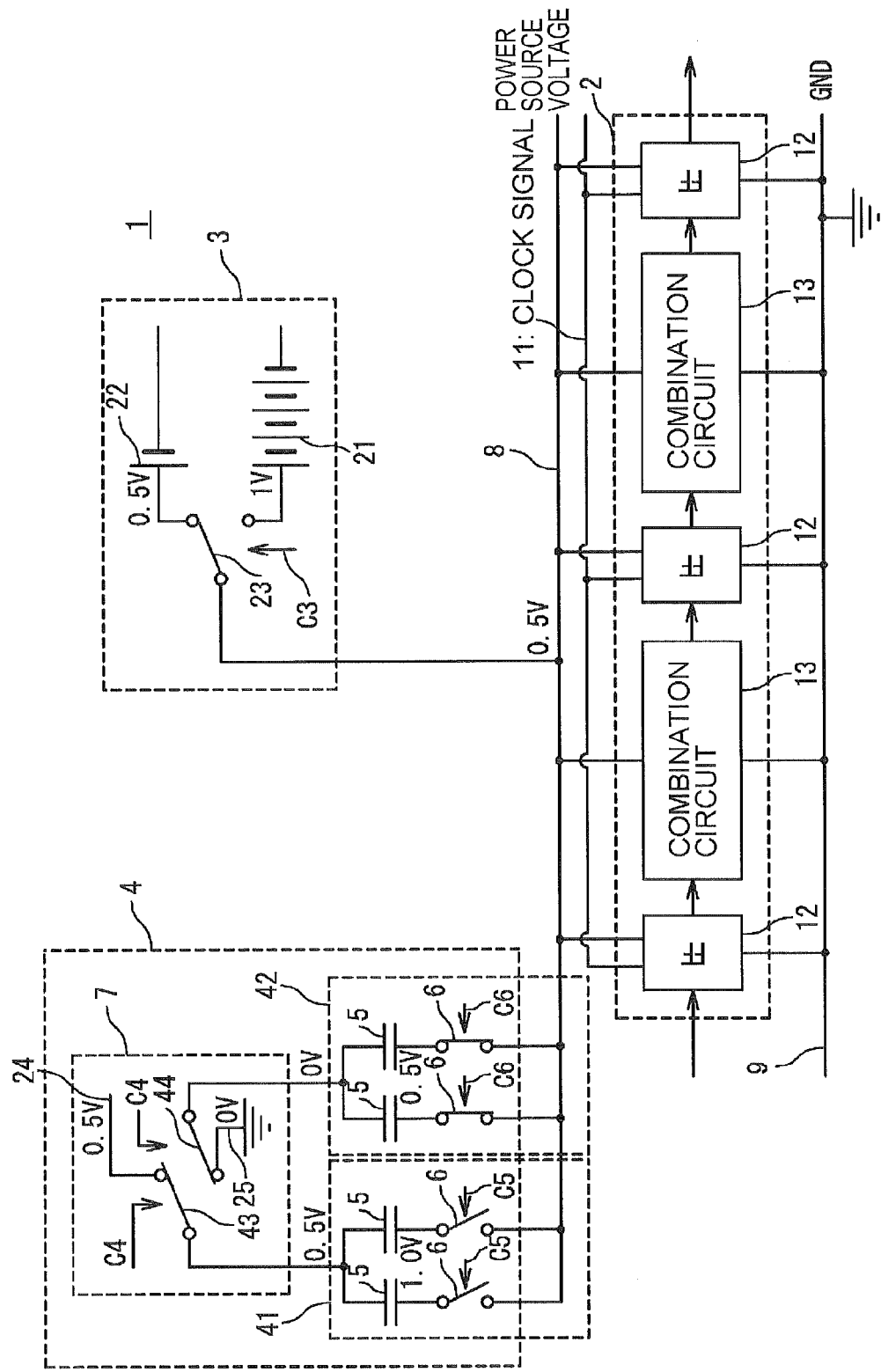
FIG. 15 is a block diagram illustrating a configuration of a charge control block 4 in the state where a charge control block first region 41 and a charge control block second region 42 are exchanged.

When the charge control block second region 42 keeps the standby mode of the 1 V power source terminal for a long time, due to leaked current, the terminal voltage on the side of the charge control first switch 6 of the capacitor unit 5 of the charge control block second region 42 drops to 1.0 V or less. Because of this, the charge control block 4 switches the fast MOS switch and the ACT power source switch after a fixed period of time elapses. FIG. 15 is a block diagram illustrating the configuration of the charge control block 4 in the state where the function of the charge control block first region 41 and the function of the charge control block second region 42 in FIG. 14 are exchanged.

As shown in FIG. 15, the charge control first switch 6 of the charge control block first region 41 cuts off the coupling of the capacitor unit 5 and the power source wiring 8 in response to the first region side first switch control signal C5. The first region side switch 43 couples the charge control block first region 41 and the second power source voltage supply node 24 in response to the second switch control signal C4. Due to this, the charge control block first region 41 functions as the charge pump, and thus the electrode on the side of the charge control first switch 6 of the capacitor unit 5 maintains the voltage of 1 V.

Furthermore, the charge control first switch 6 of the charge control block second region 42 couples the capacitor unit 5 and the power source wiring 8 in response to a second region side first switch control signal C6. The second region side switch 44 couples the charge control block second region 42 and the third power source voltage supply node 25 in response to the second switch control signal C4. Due to this, it is possible to put the charge control block first region 41 into the standby mode of the 1 V power source terminal and the charge control block second region 42 into the decoupling capacitor mode of 0.5 V. By this operation, the capacitor unit 5 of the charge control block second region 42 is replenished with charges for those lost by leaked current.

As described above, it is possible for the charge control block 4 in the semiconductor integrated circuit 1 of the second embodiment to alternately switch the decoupling capacitor mode and the standby mode of the transition voltage (1 V). It is always possible for the charge control block 4 to cause the decoupling capacitor mode and the standby mode of the transition voltage (1 V) to function at the same time.

Figure 16:
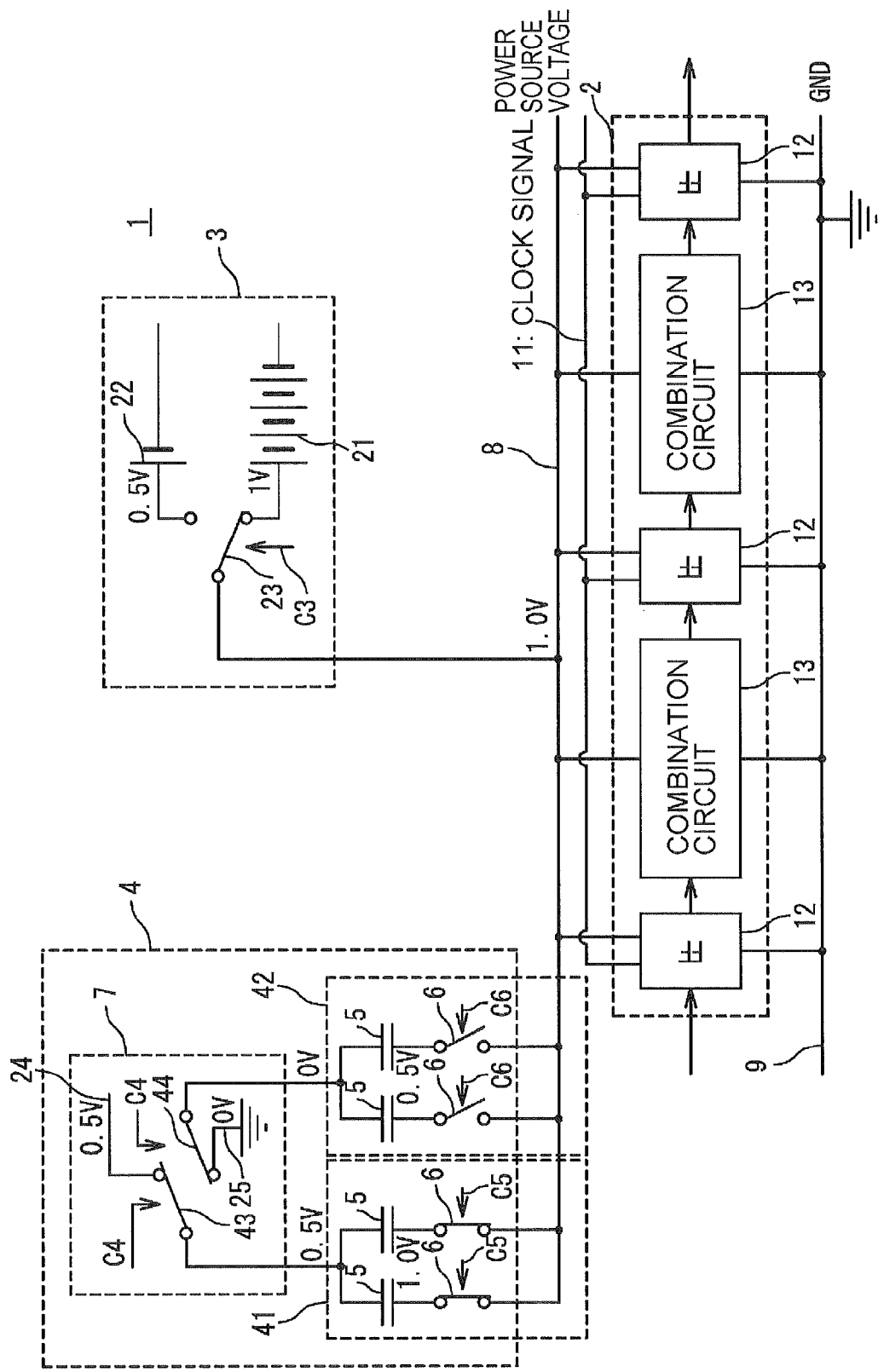
FIG. 16 is a block diagram illustrating a coupling state of each circuit of the semiconductor integrated circuit 1 in the fast computing mode.

Here, a case will be explained as an example, where the logic circuit 2 makes a transition to the fast computing mode (1.0 V) after operating in the sleep mode (0.5 V) when the charge control block first region 41 is in the standby mode of the transition voltage (1 V). FIG. 16 is a block diagram illustrating the coupling state of each circuit of the semiconductor integrated circuit 1 in the fast computing mode. As shown in FIG. 16, the power source voltage selector switch 23 couples the power source wiring 8 and the second power source voltage generation circuit 22 in response to the power source voltage selector switch control signal C3. The charge control first switch 6 of the charge control block first region 41 couples the capacitor units 5 in the standby mode of the transition voltage (1 V) and the power source wiring 8 in response to the first region side first switch control signal C5. At this time, the charge control first switch 6 of the charge control block first region 41 couples the capacitor unit 5 of the charge control block first region 41 to the power source wiring of the logic circuit via the charge control first switch 6 at the same time as (or a moment after) the transition of the power source voltage selector switch 23.

It is configured such that the capacitor unit 5 constituting the charge control block 4 of the second embodiment and the charge control first switch 6 are arranged, for example, in the form of a matrix and when a part of the charge control block 4 is in the decoupling capacitor mode, the rest is in the transition voltage standby mode. Then, by dynamically switching them, it is made possible to put the charge control block 4 into a state where the decoupling capacitor mode and the transition voltage standby mode coexist apparently at all times. Due to this, it is possible to solve a problem in which the voltage drops in the transition voltage standby mode due to leaked current and it is made possible to cause the power source stability and the fast power source transition of the logic circuit to coexist.

Meanwhile, in the case where the logic circuit is caused to make a transition from the fast mode (1.0 V) to the sleep mode (0.5 V), it is also made possible to cause the logic circuit to make power source voltage transition both stably and quickly by performing the same operation. Here, explanation will be given on the assumption that the transition power source voltages are specified to be 0.5 V and 1.0 V, but the combination of the transition power source voltages is not limited to this. Furthermore, for two or more transition voltages, for example, 1.2 V, 1.0 V, and 0.5 V, it is made possible to cause the transition voltage standby mode for each of the transition voltages and the decoupling capacitor mode to coexist by the same technique.

As described above, the embodiments of the present invention have been explained specifically. The invention of the present application is not limited to the embodiments described above and various modifications are possible within a scope not departing from the gist of the invention. Furthermore, it is possible to carry out the plurality of embodiments described above, in combination with one another as long as there exists no contradiction between the configurations and operations thereof.

What is claimed is:

1. A semiconductor integrated circuit comprising:
    a logic circuit having a computing mode that is an operation mode when computing is performed, and a sleep mode that is an operation mode when the computing is suspended;
    a power source circuit that generates a power source voltage to be supplied to the logic circuit;
    a power source wiring that couples the power source circuit and the logic circuit; and
    a charge control block that holds charges for controlling the voltage of the power source wiring,
    wherein the power source circuit generates a first power source voltage for operating the logic circuit in the computing mode and a second power source voltage for operating the logic circuit in the sleep mode, and
    wherein the charge control block includes:
        a capacitor;
        a first switch provided between one end of the capacitor and the power source wiring; and
        a voltage supply unit that supplies the second power source voltage or a third power source voltage lower than the second power source voltage, to the other end of the capacitor.

2. The semiconductor integrated circuit according to claim 1,
    wherein the power source circuit comprises:
        a first power source voltage generation circuit that generates the first power source voltage;
        a second power source voltage generation circuit that generates the second power source voltage; and
        a power source voltage selector switch that controls the coupling of one of the first power source voltage generation circuit and the second power source voltage generation circuit, and the power source wiring,
    wherein the voltage supply unit includes:
        a second power source voltage supply node that supplies the second power supply voltage;
        a third power source voltage supply node that supplies the third power source voltage; and
        a second switch coupled to the other end of the capacitor and that controls the coupling of one of the second power source voltage supply node and the third power source voltage supply node, and the other end, and
    wherein the capacitor functions as a decoupling capacitor that stabilizes the voltage of the power source wiring and at the same time, and functions as a battery that charges the power source wiring.

3. The semiconductor integrated circuit according to claim 2,
    wherein the first switch couples the power source wiring and the capacitor in the sleep mode,
    wherein the second switch couples the third power source voltage supply node and the capacitor in the sleep mode, and
    wherein the power source voltage selector switch couples the power source wiring and the second power source voltage generation circuit in the sleep mode.

4. The semiconductor integrated circuit according to claim 3,
    wherein the first switch cuts off the coupling of the power source wiring and the capacitor when a transition is made from the sleep mode to the computing mode,
    wherein the second switch couples the second power source voltage supply node and the capacitor after the coupling of the power source wiring and the capacitor is cut off, and
    wherein the first switch couples the power source wiring and the capacitor in synchronization with a timing at which the first power source voltage is supplied to the power source wiring, after the second power source voltage supply node and the capacitor are coupled.

5. The semiconductor integrated circuit according to claim 4,
    wherein the first switch couples the power source wiring and the capacitor in the computing mode,
    wherein the second switch couples the second power source voltage supply node and the capacitor in the computing mode, and
    wherein the power source voltage selector switch couples the power source wiring and the first power source voltage generation circuit in the computing mode.

6. The semiconductor integrated circuit according to claim 5,
    wherein the first switch cuts off the coupling of the power source wiring and the capacitor when a transition is made from the computing mode to the sleep mode,
    wherein the second switch couples the third power source voltage supply node and the capacitor after the coupling of the power source wiring and the capacitor is cut off, and
    wherein the first switch couples the power source wiring and the capacitor in synchronization with a timing at which the second power source voltage is supplied to the power source wiring, after the third power source voltage supply node and the capacitor are coupled.

7. The semiconductor integrated circuit according to claim 1,
    wherein the capacitor includes a plurality of capacitor cells, and
    wherein the first switch controls the coupling of each of the capacitor cells and the power source wiring independently of each of the capacitor cells in response to a first switch control signal.

8. A method of operating a semiconductor integrated circuit including a logic circuit having a plurality of operation modes, the method comprising:
    generating a power source voltage to be supplied to the logic circuit;
    supplying the power source voltage to the logic circuit; and
    controlling the voltage of a power source wiring,
    wherein the generating a power source voltage includes:
        generating a first power source voltage for operating the logic circuit in a computing mode; and
        generating a second power source voltage for operating the logic circuit in a sleep mode,
    wherein the supplying the power source voltage includes supplying the second power source voltage to the power source wiring in the sleep mode, and
    wherein the controlling the voltage of the power source wiring includes:
        coupling the power source wiring and one end of a capacitor in the sleep mode; and
        supplying a third power source voltage lower than the second power source voltage to an other end of the capacitor.

9. The method of operating a semiconductor integrated circuit according to claim 8,
    wherein the controlling a voltage includes:
        cutting off the coupling of the power source wiring and the capacitor when a transition is made from the sleep mode to the computing mode;

supplying the second power source voltage to the other end of the capacitor after the coupling of the power source wiring and the capacitor is cut off; and coupling the power source wiring and the capacitor in synchronization with a timing at which the first power source voltage is supplied to the power source wiring, after the second power source voltage is supplied to the other end of the capacitor.

10. The method of operating a semiconductor integrated circuit according to claim 9, wherein the supplying a voltage includes the supplying the first power source voltage to the power source wiring in the computing mode, wherein the controlling a voltage includes:

coupling the power source wiring and the capacitor in the computing mode; and supplying the second power source voltage to the other end of the capacitor.

11. The method of operating a semiconductor integrated circuit according to claim 10, wherein the controlling a voltage includes:

cutting off the coupling of the power source wiring and the capacitor when a transition is made from the computing mode to the sleep mode;

supplying the third power source voltage to the other end of the capacitor after the coupling of the power source wiring and the capacitor is cut off; and coupling the power source wiring and the capacitor in synchronization with a timing at which the second power source voltage is supplied to the power source wiring, after the third power source voltage is supplied to the other end of the capacitor.

* * * * *